United States Patent
Kang et al.

(10) Patent No.: US 10,761,633 B2
(45) Date of Patent: Sep. 1, 2020

(54) TOUCH DISPLAY DEVICE, TOUCH-DRIVING CIRCUIT, AND TOUCH-SENSING METHOD

(71) Applicant: LG Display Co., Ltd., Seoul (KR)

(72) Inventors: HyeongWon Kang, Seoul (KR); HongJu Lee, Seoul (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/216,252

(22) Filed: Dec. 11, 2018

(65) Prior Publication Data
US 2019/0204971 A1    Jul. 4, 2019

(30) Foreign Application Priority Data
Dec. 29, 2017 (KR) .................. 10-2017-0184435

(51) Int. Cl.
| | | |
|---|---|---|
| *G06F 3/041* | (2006.01) | |
| *G06F 3/044* | (2006.01) | |
| *G06F 3/0354* | (2013.01) | |
| *H01L 27/32* | (2006.01) | |

(52) U.S. Cl.
CPC ........ *G06F 3/0412* (2013.01); *G06F 3/03545* (2013.01); *G06F 3/044* (2013.01); *G06F 3/0416* (2013.01); *G06F 3/0443* (2019.05); *G06F 3/04164* (2019.05); *G06F 3/04166* (2019.05); *G06F 3/04184* (2019.05); *G06F 2203/04104* (2013.01); *H01L 27/323* (2013.01)

(58) Field of Classification Search
CPC .............. G06F 3/0412; G06F 3/04166; G06F 3/04184; G06F 3/04164; G06F 3/0443; G06F 3/03545; G06F 3/0416; G06F 3/044

USPC .......................... 345/173, 174, 178; 324/679
See application file for complete search history.

(56) References Cited

U.S. PATENT DOCUMENTS

| | | | | |
|---|---|---|---|---|
| 6,690,493 | B1 * | 2/2004 | Kobayashi | H04N 5/3454 348/307 |
| 9,569,035 | B1 * | 2/2017 | Lee | G06F 3/0416 |
| 9,857,914 | B2 * | 1/2018 | Kim | G06F 3/0418 |
| 10,054,725 | B2 * | 8/2018 | Van Heugten | G02C 7/083 |
| 2003/0223540 | A1 * | 12/2003 | Hayashida | G01T 1/17 378/98.8 |
| 2011/0254805 | A1 * | 10/2011 | Tanimizu | G06F 3/0416 345/174 |
| 2012/0019266 | A1 * | 1/2012 | Yoshikawa | G06F 3/0416 324/679 |
| 2013/0249825 | A1 * | 9/2013 | Kang | G06F 3/03547 345/173 |
| 2014/0327644 | A1 * | 11/2014 | Mohindra | G06F 3/044 345/174 |
| 2016/0018921 | A1 * | 1/2016 | Matlick | G06F 3/0416 345/174 |
| 2016/0098151 | A1 * | 4/2016 | Kim | G06F 3/0418 345/174 |

(Continued)

*Primary Examiner* — Prabodh M Dharia
(74) *Attorney, Agent, or Firm* — Morgan, Lewis & Bockius LLP

(57) ABSTRACT

A touch display device, a touch driving circuit, and a touch-sensing method are disclosed in which control operation timing at which a charge control circuit connected to an input terminal of a pre-amplifier is controlled in consideration of a difference in a location or time constant for each touch electrode. Accordingly, unnecessary variation in a signal-to-noise ratio for each touch electrode can be reduced, and thus touch sensitivity can be improved.

24 Claims, 22 Drawing Sheets

(56) References Cited

U.S. PATENT DOCUMENTS

| | | | |
|---|---|---|---|
| 2017/0108992 A1* | 4/2017 | Lee | G06F 3/0414 |
| 2017/0322669 A1* | 11/2017 | Hotelling | G06F 3/044 |
| 2018/0173342 A1* | 6/2018 | Lee | G06F 3/044 |
| 2019/0102022 A1* | 4/2019 | Jang | G06F 3/0412 |
| 2019/0121468 A1* | 4/2019 | Jun | G02F 1/13338 |
| 2019/0138150 A1* | 5/2019 | Kim | G06F 3/0418 |

\* cited by examiner

TOUCH DISPLAY DEVICE, TOUCH-DRIVING CIRCUIT, AND TOUCH-SENSING METHOD

CROSS REFERENCE TO RELATED APPLICATION

This application claims priority from Korean Patent Application No. 10-2017-0184435, filed on Dec. 29, 2017, which is hereby incorporated by reference for all purposes as if fully set forth herein.

BACKGROUND

1. Technical Field

The present disclosure relates to a touch display device, a touch-driving circuit, and a touch-sensing method.

2. Discussion of the Related Art

According to the development of the information-oriented society, demand for display devices for displaying images in various forms has increased, and recently, a variety of display devices, such as liquid crystal display devices, plasma display devices and organic light-emitting display devices, have come to be used.

Such a display device provides a touch-based input scheme which enables a user to break away from a conventional input scheme, in which a button, a keyboard, a mouse, and the like are used, and to input information or a command easily, intuitively and conveniently.

The touch display device sequentially senses a plurality of touch electrodes and collects sensing values of respective touch electrodes, so as to detect whether there is a touch and the touch coordinates. However, since the plurality of touch electrodes are arranged at different locations, the sensing values for respective touch electrodes are unintentionally different, so that a signal-to-noise ratio significantly decreases and thus touch sensitivity deteriorates at a particular location.

SUMMARY

Accordingly, embodiments of the present disclosure are directed to a touch display device, a touch-driving circuit, and a touch-sensing method that substantially obviate one or more of the problems due to limitations and disadvantages of the related art An aspect of embodiments of the present disclosure is to provide a touch display device, a touch-driving circuit, and a touch-sensing method that can realize a high signal-to-noise ratio without any influence of noise at any location even though respective touch electrodes are located at different positions.

Another aspect of the present disclosure is to provide a touch display device, a touch-driving circuit, and a touch-sensing method which can prevent saturation of sensing data and realize a high signal-to-noise ratio by connecting a charge control circuit to an input terminal of a pre-amplifier.

Still another aspect of the present disclosure is to provide a touch display device, a touch-driving circuit, and a touch-sensing method which can reduce unnecessary variation in a signal-to-noise ratio for each touch electrode and improve touch sensitivity by controlling control operation timing of the charge control circuit connected to the input terminal of the pre-amplifier in consideration of a difference in the location or a time constant for each touch electrode.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described, a touch display device comprises a touch screen panel, including a plurality of touch electrodes, and a touch-driving circuit, configured to supply a driving signal to the touch screen panel and receive a sensing signal.

The touch-driving circuit may include a pre-amplifier, having a first input terminal to which the sensing signal for a touch electrode is input, and a charge control circuit, electrically connected between the first input terminal of the pre-amplifier and a charge control signal input terminal to which a charge control signal is input.

The charge control circuit may include a charge control switch and a charge control capacitor connected between the first input terminal of the pre-amplifier and the charge control signal input terminal via the charge control switch.

The charge control circuit may control a charge input to the first input terminal of the pre-amplifier by turning on the charge control switch and changing a voltage level in the charge control signal after a first control time passes from a time point at which the driving signal changes from a first voltage level to a second voltage level.

The first control time may be changed according to a location or a time constant of the touch electrode.

For example, the first control time may be set to be longer as the touch electrode is located farther from the touch-driving circuit or has a larger time constant.

In contrast, a rising control time may be set to be shorter as the touch electrode is located closer to the touch-driving circuit or has a smaller time constant.

After the first control time passes from the time point at which the driving signal changes from the first voltage level to the second voltage level, the charge control signal applied to one electrode (an electrode connected to the charge control signal input terminal among the first electrode and the second electrode of the charge capacitor) of the charge control capacitor connected to the first input terminal of the pre-amplifier by the charge control switch may be changed from a third voltage level to a fourth voltage level.

After a second control time passes after the time point at which the driving signal starts changing from the second voltage level to the first voltage level, the charge control signal may change from the fourth voltage level to the third voltage level.

The second control time may be changed according to the location or the time constant of the touch electrode.

For example, the second control time may be set to be longer as the touch electrode is located farther from the touch-driving circuit or has a larger time constant.

In contrast, the second control time may be set to be shorter as the touch electrode is located closer to the touch-driving circuit or has a smaller time constant.

The first voltage level and the second voltage level of the driving signal may be, for example, a low level and a high level, respectively. Further, the third voltage level and the fourth voltage level of the charge control signal may be, for example, a low level and a high level, respectively.

The low level of the driving signal and the low level of the charge control signal may be the same voltage value or different voltage values. Further, the high level of the driving signal and the high level of the charge control signal may be the same voltage value or different voltage values.

For example, the charge control switch may be turned on after a first rising control time passes from a time point at which the driving signal starts rising from the first voltage level, corresponding to a low level, to the second voltage level, corresponding to a high level, and the charge control signal may rise from the third voltage level, corresponding to the low level, to the fourth voltage level, corresponding to the high level, after a second rising control time passes from a time point at which the charge control switch is turned on.

The sum of the first rising control time and the second rising control time may correspond to the first control time.

The first rising control time may be changed according to the location or the time constant of the touch electrode.

For example, the first rising control time may be set to be longer as the touch electrode is located farther from the touch-driving circuit or has a larger time constant.

In contrast, the first rising control time may be set to be shorter as the touch electrode is located closer to the touch-driving circuit or has a smaller time constant.

The length of the second rising control time may be equal to or shorter than the length of a period during which the charge control switch maintains an on state.

For example, the charge control switch may be turned off after the charge control signal rises from the third voltage level to the fourth voltage level, the charge control switch may be turned on after a first falling control time passes from a time point at which the driving signal starts falling from the second voltage level to the first voltage level, and the charge control signal may fall from the fourth voltage level to the third voltage level after a second falling control time passes from a time point at which the charge control switch is turned on.

The sum of the first falling control time and the second falling control time may correspond to the second control time.

The first falling control time may be changed according to the location or the time constant of the touch electrode.

For example, the first falling control time may be set to be longer as the touch electrode is located farther from the touch-driving circuit or has a larger time constant.

In contrast, the first falling control time may be set to be shorter as the touch electrode is located closer to the touch-driving circuit or has a smaller time constant.

The length of the second falling control time may be equal to or shorter than the length of a period during which the charge control switch maintains an on state.

During a rising control time, a voltage-level-variable change in the driving signal may vary depending on the location or the time constant of the touch electrode.

During the first control time, the voltage-level-variable change in the driving signal may be smaller as the touch electrode is located farther from the touch-driving circuit or has a larger time constant.

In contrast, during the first control time, the voltage-level-variable change in the driving signal may be larger as the touch electrode is located closer to the touch-driving circuit or has a smaller time constant.

Meanwhile, the charge control capacitor within the charge control circuit may include a first charge control capacitor and a second charge control capacitor.

First electrodes of the first charge control capacitor and the second charge control capacitor may be connected to each other, and second electrodes of the first charge control capacitor and the second charge control capacitor may be connected to each other.

The charge control circuit may further include a first selection switch, configured to connect the first electrode of the first charge control capacitor to the charge control switch, and a second selection switch, configured to connect the first electrode of the second charge control capacitor to the charge control switch.

In accordance with another aspect of the present disclosure, a touch-driving circuit, including a pre-amplifier having a first input terminal configured to output a driving signal to touch electrodes and receive a sensing signal for the touch electrode, and a charge control circuit, electrically connected between the first input terminal of the pre-amplifier and a charge control signal input terminal to which a charge control signal is input, is provided.

The charge control circuit may include a charge control switch and a charge control capacitor connected between the first input terminal of the pre-amplifier and the charge control signal input terminal via the charge control switch.

The charge control circuit may control a charge input to the first input terminal of the pre-amplifier by turning on the charge control switch and changing a voltage level in the charge control signal after a first control time passes from the time point at which the driving signal changes from a first voltage level to a second voltage level.

The first control time may be changed according to a location or a time constant of the touch electrode.

The first control time may be set to be longer as the touch electrode is located farther from the touch-driving circuit or has a larger time constant.

The first voltage level and the second voltage level of the driving signal may be, for example, a low level and a high level. Further, the third voltage level and the fourth voltage level of the charge control signal may be, for example, a low level and a high level.

The low level of the driving signal and the low level of the charge control signal may be the same voltage value or different voltage values. Further, the high level of the driving signal and the high level of the charge control signal may be the same voltage value or different voltage values.

For example, the charge control switch may be turned on after a first rising control time passes from a time point at which the driving signal starts rising from the first voltage level, corresponding to a low level, to the second voltage level, corresponding to a high level, and the charge control signal may rise from the third voltage level, corresponding to the low level, to the fourth voltage level, corresponding to the high level, after a second rising control time passes from a time point at which the charge control switch is turned on.

The sum of the first rising control time and the second rising control time may correspond to the first control time, and the first rising control time may be changed according to the location or the time constant of the touch electrode.

The length of the second rising control time may be equal to or shorter than the length of a period during which the charge control switch maintains an on state.

A charge amount corresponding to the sensing signal input to the first input terminal of the pre-amplifier in an on state of the charge control switch may be different from a charge amount corresponding to the sensing signal input into the first input terminal of the pre-amplifier in an off state of the charge control switch.

The charge control capacitor may include a first charge control capacitor and a second charge control capacitor, first electrodes of the first charge control capacitor and the second charge control capacitor may be connected to each other, second electrodes of the first charge control capacitor and the second charge control capacitor may be connected to each other, and the charge control circuit may further include a first selection switch, configured to connect the first electrode of the first charge control capacitor and the charge control switch, and a second selection switch, configured to connect the first electrode of the second charge control capacitor and the charge control switch.

In accordance with another aspect of the present disclosure, a touch-sensing method, including outputting a driving signal to touch electrodes by a touch-driving circuit, receiving a sensing signal from the touch electrodes by the touch-driving circuit, and generating sensing data based on the sensing signal and outputting the generated sensing data by the touch-driving circuit, is provided.

During the outputting of the driving signal, a charge control capacitor may be connected between a first input terminal, to which the sensing signal is input in the touch-driving circuit, and a charge control signal input terminal, to which a charge control signal different from the driving signal is input into the touch-driving circuit after a first time passes from the time point at which the driving signal starts changing from a first voltage level to a second voltage level, and the charge control signal changing from a third voltage level to a fourth voltage level may be applied to one electrode (an electrode connected to the charge control signal input terminal among the first electrode and the second electrode of the charge capacitor) of the charge control capacitor.

The first time may be changed according to a location or a time constant of the touch electrode.

The first time may be set to be longer as the touch electrode is located farther from the touch-driving circuit and has a larger time constant.

The embodiments of the present disclosure may provide a touch display device, a touch-driving circuit, and a touch-sensing method which can realize a high signal-to-noise ratio without any influence of noise at any location even though respective touch electrodes are located at different positions.

The embodiments of the present disclosure may provide a touch display device, a touch-driving circuit, and a touch-sensing method which can prevent saturation of sensing data and realize a high signal-to-noise ratio by connecting a charge control circuit to an input terminal of a pre-amplifier.

The embodiments of the present disclosure may provide a touch display device, a touch-driving circuit, and a touch-sensing method which can reduce unnecessary variation in a signal-to-noise ratio for each touch electrode and improve touch sensitivity by controlling control operation timing of the charge control circuit connected to the input terminal of the pre-amplifier in consideration of a difference in the location or a time constant for each touch electrode.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the disclosure and are incorporated and constitute a part of this application, illustrate embodiments of the disclosure and together with the description serve to explain various principles. In the drawings.

DETAILED DESCRIPTION

Figure 1:
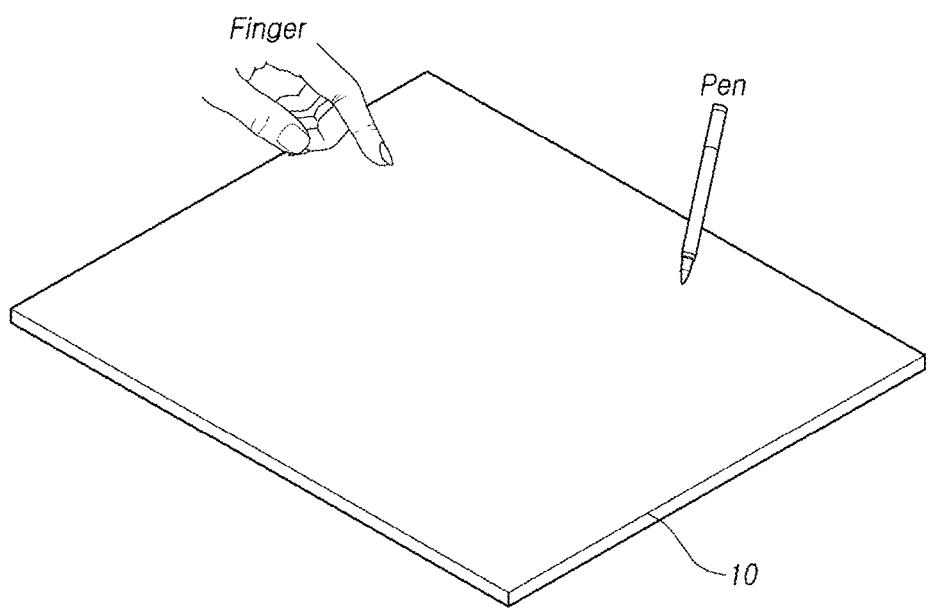
FIG. 1 illustrates a touch display device according to embodiments of the present disclosure.

Hereinafter, some embodiments of the present disclosure will be described in detail with reference to the accompanying illustrative drawings. In designating elements of the drawings by reference numerals, the same elements will be designated by the same reference numerals although they are shown in different drawings. Further, in the following description of the present disclosure, a detailed description of known functions and configurations incorporated herein will be omitted when it may make the subject matter of the present disclosure rather unclear.

In addition, terms, such as first, second, A, B, (a), (b) or the like may be used herein when describing components of the present disclosure. Each of these terminologies is not used to define an essence, order or sequence of a corresponding component but used merely to distinguish the corresponding component from other component(s). In the case that it is described that a certain structural element "is connected to", "is coupled to", or "is in contact with" another structural element, it should be interpreted that another structural element may "be connected to", "be coupled to", or "be in contact with" the structural elements as well as that the certain structural element is directly connected to or is in direct contact with another structural element.

FIG. 1 illustrates a touch display device 10 according to embodiments of the present disclosure.

The touch display device 10 according to embodiments of the present disclosure may provide not only an image display function of displaying an image but also a function of sensing a touch by a finger and a touch tool such as a pen.

The "pen" may have a signal transmission/reception function or perform an operation linked with the touch display device 10, and may include an active pen, which is a touch tool including its own power source, and a passive pen, which is a touch tool having neither a signal transmission/reception function nor a its own power source.

The touch tool may be not only a finger, but also any object that can touch a screen instead of the finger, and may also be referred to as a "touch object" or a "touch pointer".

Hereinafter, the finger may be considered as a representative of passive touch tools such as a passive pen, and the pen may be considered as a representative of active touch tools such as an active pen. The pen may be also referred to as a "stylus", a "stylus pen", or an "active stylus pen".

The touch display device 10 according to embodiments of the present disclosure may be, for example, a television (TV), a monitor, or a mobile device such as a tablet or a smart phone.

The touch display device 10 according to embodiments of the present disclosure may include a display part for providing an image display function and a touch-sensing part for touch sensing.

Hereinafter, the structure of the display part and the touch-sensing part of the touch display device 10 will be briefly described with reference to FIGS. 2 to 3.

Figure 2:
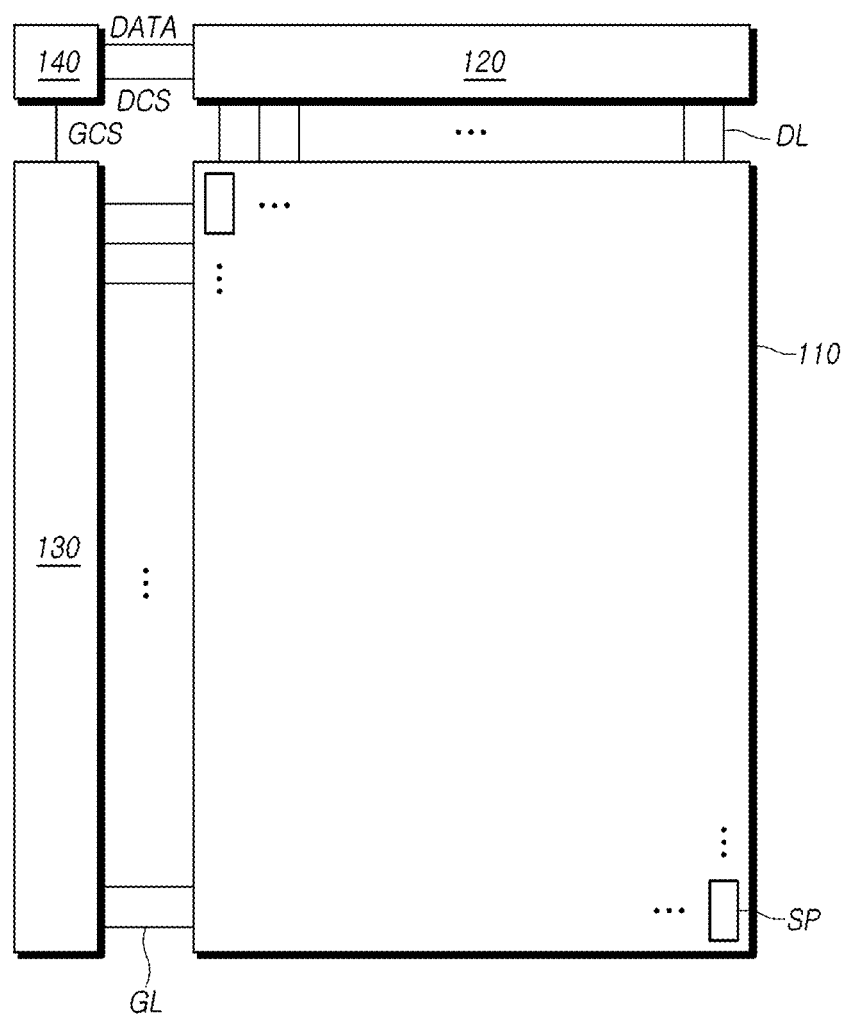
FIG. 2 illustrates a display part of the touch display device according to embodiments of the present disclosure.

FIG. 2 illustrates the display part of the touch display device 10 according to embodiments of the present disclosure.

Referring to FIG. 2, the display part of the touch display device 10 according to embodiments of the present disclosure may include a display panel 110, a data-driving circuit 120, a gate-driving circuit 130, and a display controller 140.

The display panel 110 is disposed on a plurality of data lines (DL) and a plurality of gate lines (GL), and a plurality of subpixels (SP) defined (partitioned) by the plurality of data lines (DL) and the plurality of gate lines (GL) is disposed thereon.

The data-driving circuit 120 drives the plurality of data lines (DL) by supplying a data voltage to the plurality of data lines (DL).

The gate-driving circuit 130 drives the plurality of gate lines (GL) by sequentially supplying a scan signal to the plurality of gate lines (GL).

The display controller 140 controls the operation of the data-driving circuit 120 and the gate-driving circuit 130 by supplying various control signals (DCS and GCS) to the data-driving circuit 120 and the gate-driving circuit 130.

The display controller 140 starts a scan according to timing implemented in each display frame, switches input image data received from the outside according to a data signal format used in the data-driving circuit 120, outputs the switched image data (DATA), and controls data driving at a proper time based on the scan.

The display controller 140 may be a timing controller used in general display technology or a control device that includes the timing controller and further performs another control function.

The display controller 140 may be implemented as an element that is separate from the data-driving circuit 120, or may be implemented as a circuit that is integrated with the data-driving circuit 120.

Meanwhile, the data-driving circuit 120 may include at least one source driver integrated circuit.

Each source driver integrated circuit may include a shift register, a latch circuit, a Digital-to-Analog Converter (DAC), an output buffer, and the like. In some cases, the SDIC may further include an Analog-to-Digital Converter (ADC).

The gate-driving circuit 130 may include at least one gate driver integrated circuit.

Each gate driver integrated circuit may include a shift register, a level shifter, and the like.

The data-driving circuit 120 may be located only on one side (for example, the upper side or lower side) of the display panel 110, or may be located on both sides (for example, both the upper side and the lower side) of the display panel 110 according to a driving scheme or a panel design scheme in some cases.

The gate-driving circuit 130 may be located only on one side (for example, the left side or the right side) of the display panel 110, or may be located on both sides (for example, both the left side and the right side) of the display panel 110 according to a driving scheme or a panel design scheme in some cases.

Meanwhile, the display panel 110 may be any of various types of display panel, such as a liquid crystal display panel, an organic light-emitting display panel, and a plasma display panel.

Figure 3:
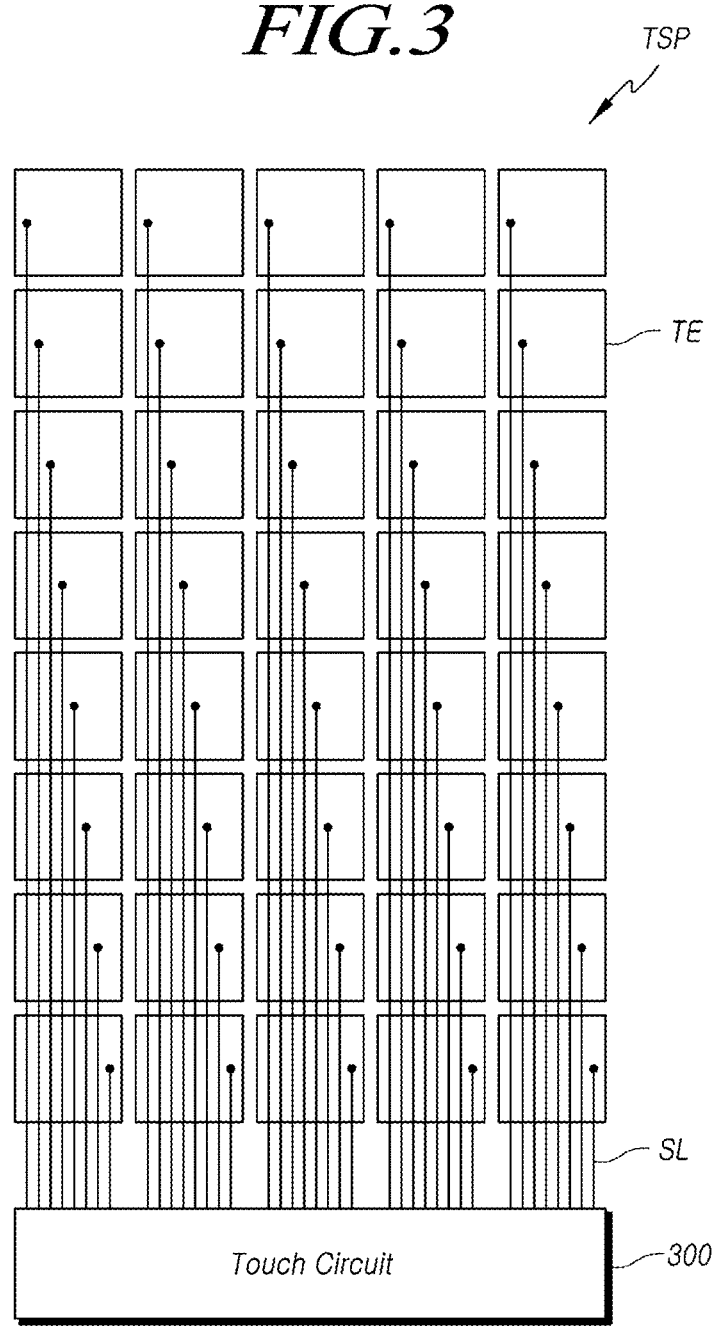
FIG. 3 illustrates a touch-sensing part of the touch display device according to embodiments of the present disclosure.

FIG. 3 illustrates the touch-sensing part of the touch display device according to embodiments of the present disclosure.

Referring to FIG. 3, the touch display device 10 may sense whether there is a touch by a finger and/or a pen through a capacitance-based touch-sensing scheme, and may also sense a touch location.

To this end, as illustrated in FIG. 3, the touch display device 10 may include a touch screen panel (TSP) on which a plurality of touch electrodes (TE) is arranged and a touch circuit 300 for driving the same.

The touch display device 10 may provide a self-capacitance-based touch-sensing function of sensing a touch input by measuring the capacitance formed in every touch electrode (TE) or a change therein according to whether there is a touch and a touch location.

A plurality of touch electrodes (TE) may be arranged on the touch screen panel (TSP).

A plurality of signal lines (SL) for electrically connecting the plurality of touch electrodes (TE) and the touch circuit 300 may be arranged on the touch screen panel (TSP).

The touch circuit 300 may sense the touch electrodes (TE) by supplying a driving signal to one or more of the plurality of touch electrodes (TE) and receiving a sensing signal from the touch electrodes (TE) to which the driving signal is applied. The driving signal may be a modulation signal of which a voltage level is variable (for example, a pulse-width-modulation signal).

Meanwhile, the touch display device 10 may provide a mutual-capacitance-based touch-sensing function. In this case, the plurality of touch electrodes (TE) may be divided into a driving electrode (transmission electrode) and a sensing electrode (reception electrode), in which case a driving signal is applied to the touch electrode (TE) corresponding to the driving electrode and a sensing signal is detected in the touch electrode (TE) corresponding to the sensing electrode. Whether there is a touch and/or touch coordinates may be sensed on the basis of capacitance (mutual capacitance) between the touch electrode (TE) corresponding to the driving electrode and the touch electrode (TE) corresponding to the sensing electrode or a change therein according to whether there is a touch and a touch location.

Hereinafter, for convenience of description, it is assumed that the touch display device 10 provides a self-capacitance-based touch-sensing scheme and that the touch screen panel (TSP) is designed as illustrated in FIG. 3 for self-capacitance-based touch sensing.

The manner in which the plurality of touch electrodes (TE) is arranged and the shape of each touch electrode (TE) illustrated in FIG. 3 are only examples, and may be variously designed.

The size of an area in which one touch electrode (TE) is formed may correspond to the size of an area in which one subpixel is formed.

Alternatively, the size of the area in which one touch electrode (TE) is formed may be larger than the size of the area in which one subpixel is formed. In this case, one touch electrode (TE) may overlap two or more data lines and two or more gate lines. For example, the size of the area in which one touch electrode (TE) is formed may correspond to the size of the area in which ones to tens of subpixels are formed.

Meanwhile, the touch screen panel (TSP) may be of an external type (referred to as an add-on type), in which the touch screen panel (TSP) is manufactured separately from the display panel 110 and then added to the display panel 110, or an internal type (referred to as an in-cell type or an on-cell type) in which the touch screen panel (TSP) is embedded into the display panel 110.

If the touch screen panel (TSP) is embedded into the display panel 110, the touch electrodes (TE) may be formed together with other electrodes or signal wires related to display driving when the display panel 110 is manufactured.

Figure 4:
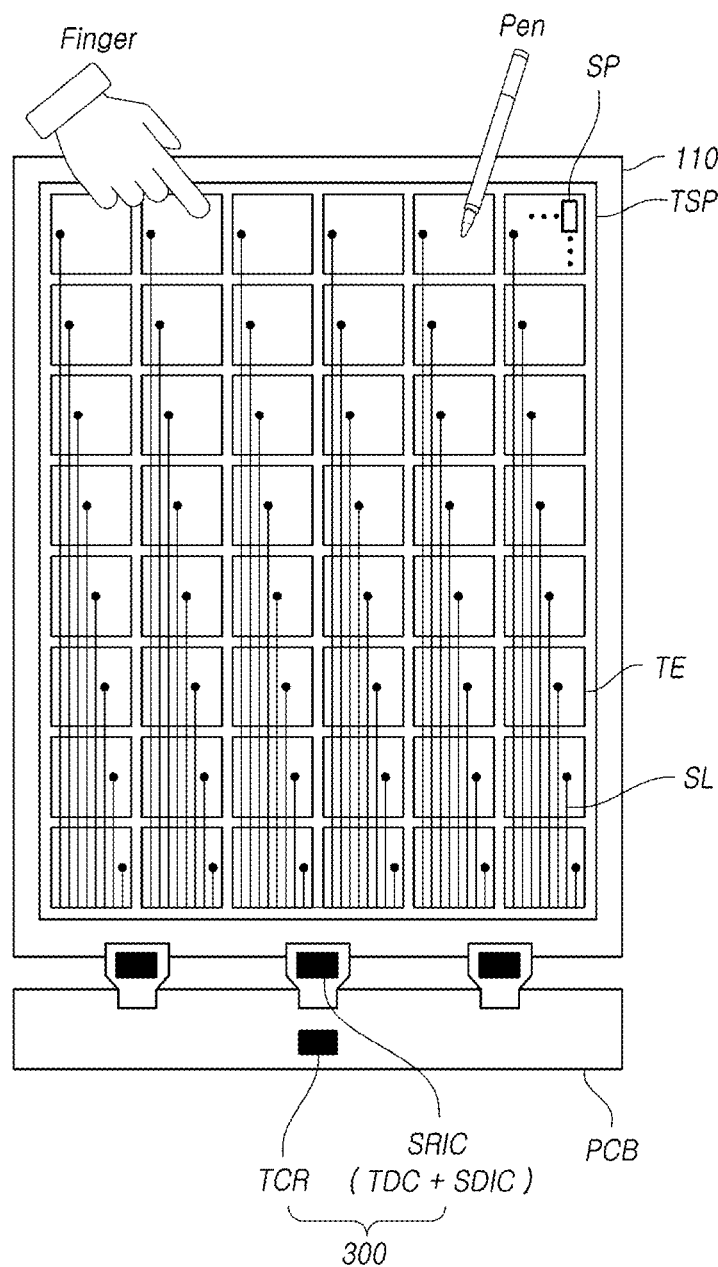
FIG. 4 illustrates an implementation example of the touch display device according to embodiments of the present disclosure.

FIG. 4 illustrates an implementation example of the touch display device 10 according to embodiments of the present disclosure. However, it is assumed that the touch screen panel (TSP) is embedded into the display panel 110.

Referring to FIG. 4, the touch circuit 300 may include one or more touch-driving circuits (TDC) for supplying a driving signal to the touch screen panel (TSP) and detecting (receiving) a sensing signal from the touch screen panel (TSP) and a touch controller (TCR) for detecting whether there is a touch and/or a touch location on the basis of the sensing signal detection result of the touch-driving circuit (TDC).

The touch circuit 300 may include one or more touch-driving circuits (TDC). Each touch-driving circuit (TDC) may be implemented as a single integrated circuit (IC). Alternatively, two or more touch-driving circuits (TDC) may be implemented as a single integrated circuit (IC).

Meanwhile, as illustrated in FIG. 4, the touch-driving circuit (TDC) included in the touch circuit 300 may be implemented as a combined integrated circuit (SRIC) together with a source driver integrated circuit (SDIC) implementing the data-driving circuit 120. That is, the touch display device 10 may include one or more combined integrated circuits (SRIC), and each combined integrated circuit (SRIC) may include the touch-driving circuit (TDC) and the source driver integrated circuit (SDIC).

As described above, through the combined implementation of the touch-driving circuit (TDC) for touch driving and the source driver integrated circuit (SDIC) for data driving, touch driving and data driving may be effectively performed when the touch screen panel (TSP) is an internal type, in which the touch screen panel (TSP) is embedded into the display panel 110, and when signal lines (SL) connected to the touch electrodes (TE) are arranged parallel to the data lines (DL).

Meanwhile, in the case of the internal type, in which the touch screen panel (TSP) is embedded into the display panel 110, each touch electrode (TE) may be variously formed.

When the touch display device 10 is implemented as a liquid crystal display device, a common electrode to which a common voltage is applied during a display-driving period for displaying an image may be blocked into a plurality of electrodes and the plurality of blocked common electrodes may be used as a plurality of touch electrodes (TE).

In this case, a driving signal may be applied or a sensing signal may be detected in the touch electrode (TE) during a touch-driving period for sensing a touch, and the common voltage may be applied to the touch electrode (TE) during the display-driving period for displaying an image.

In this case, during the display-driving period, all of the touch electrodes (TE) may be electrically connected within the touch circuit 300, and may receive the common voltage in common.

During the touch-driving period, one or more touch electrodes (TE) selected to be sensed among the plurality of touch electrodes (TE) within the touch circuit 300 may receive the driving signal from the touch-driving circuit (TDC) of the touch circuit 300 and detect the sensing signal by the touch-driving circuit (TDC) of the touch circuit 300.

Further, each touch electrode (TE) may have therein a plurality of slits (also referred to as holes) to form an electric field with a pixel electrode (not shown) within a plurality of overlapping subpixels.

Meanwhile, when the touch display device 10 is implemented as an organic light-emitting display device, the display panel 110 may include a common electrode (for example, a cathode electrode) to which the common voltage is applied and an encapsulation layer disposed on the common electrode.

Here, the common electrode may be blocked into a plurality of electrodes, and the plurality of blocked common electrodes may be used as a plurality of touch electrodes (TE). The plurality of common electrodes may be, for example, cathode electrodes, among anode electrodes (corresponding to pixel electrodes) and cathode electrodes of Organic Light-emitting Diodes (OLED) within each subpixel (SP), and the common voltage may be a cathode voltage.

Unlike this, a plurality of touch electrodes (TE) may be separately located on the encapsulation layer located on the common electrode.

As described above, each touch electrode (TE) embedded into the display panel 110 of the touch display device 10 implemented as the organic light-emitting display device may be an electrode type having no open area (opening). At this time, each of the plurality of touch electrodes (TE) may be a transparent electrode for emission of the subpixels (SP). Alternatively, each touch electrode (TE) may be a mesh-type electrode having a plurality of open areas (openings). At this time, the open area in each touch electrode (TE) may correspond to an emission area (for example, an area in which part of the anode electrode is located) of the subpixel (SP).

Meanwhile, when the touch-driving circuit (TDC) supplies the driving signal to the touch electrodes (TE) for touch sensing, other electrodes or signal lines unrelated to touch sensing may form unnecessary parasitic capacitance with the touch electrodes (TE). Touch sensitivity may significantly deteriorate due to the parasitic capacitance.

Accordingly, when the touch-driving circuit (TDC) supplies the driving signal to the touch electrodes (TE) for touch sensing, the touch display device 10 according to embodiments of the present disclosure may perform Load-free driving (LFD) of driving a load-free driving signal, which is the same as or corresponds to the driving signal, to other electrodes or signal lines unrelated to touch sensing.

The LFD signal may have a frequency and a phase which are the same as or similar to a frequency and a phase of the driving signal. Also, the LFD signal may have an amplitude which is the same as or similar to an amplitude of the driving signal.

At this time, at least one signal characteristic among the frequency, the phase, and the amplitude of the LFD signal which is similar to at least one signal characteristic among the frequency, the phase, and the amplitude of the driving signal means that they are not the same as each other, but that the difference therebetween is within a predetermined allowable error range (for example, 1%, 2%, or 5%).

As described above, the LFD signal is a signal having a signal characteristic which is the same as or similar to that of the driving signal for touch sensing, and may be the driving signal itself applied to the touch electrodes (TE) to be sensed, or may include the driving signal.

In an example of the LFD, the LFD signal may be applied to all or some of the data lines (DL) during the touch-driving period.

In another example of the LFD, the LFD signal may be applied to all or some of the gate lines (GL) during the touch-driving period.

In still another example of the LFD, the LFD signal may be applied to touch electrodes adjacent to the touch electrodes (TE) to be sensed or all touch electrodes (TE) during the touch-driving period.

In yet another example of the LFD, the touch-driving circuit (TDC) may simultaneously supply the driving signal (LFD signal) to all touch electrodes (TE) and sequentially sense only one or more touch electrodes (TE) to be sensed among all touch electrodes (TE) during the touch-driving period. When the driving signal (load-free driving signal) is simultaneously applied to all touch electrodes (TE), the load-free driving signal may be also applied to all data lines (DL) and all gate lines (GL). In this case, the LFD signal is the same as the driving signal for touch sensing, and may be the driving signal itself applied to the touch electrodes (TE) to be sensed.

Meanwhile, each of the touch-driving circuit (TDC) and the source driver integrated circuit (SDIC) may be implemented as a Tape-Carrier-Package (TCP) type, a Chip-On-Film (COF) type, or a Chip-On-Glass (COG) type.

Further, the combined integrated circuit (SRIC) obtained by combining the touch-driving circuit (TDC) and the source driver integrated circuit (SDIC) may be implemented in a Tape-Carrier-Package (TCP) type, a Chip-On-Film (COF) type, or a Chip-On-Glass (COG) type.

For example, when the combined integrated circuit (SRIC) is implemented in the COF type, as illustrated in the example of FIG. 4, the combined integrated circuit (SRIC) may be mounted on a film, and one end of the film on which the combined integrated circuit (SRIC) is mounted may be connected to an external pad part, and the other end thereof may be connected to a printed circuit board (PCB).

The touch controller (TCR) may be mounted on the printed circuit board (PCB).

Meanwhile, the touch-driving circuit (TDC) and the touch controller (TCR) may be implemented as separate elements, or may be integrated into a single element.

Figure 5:
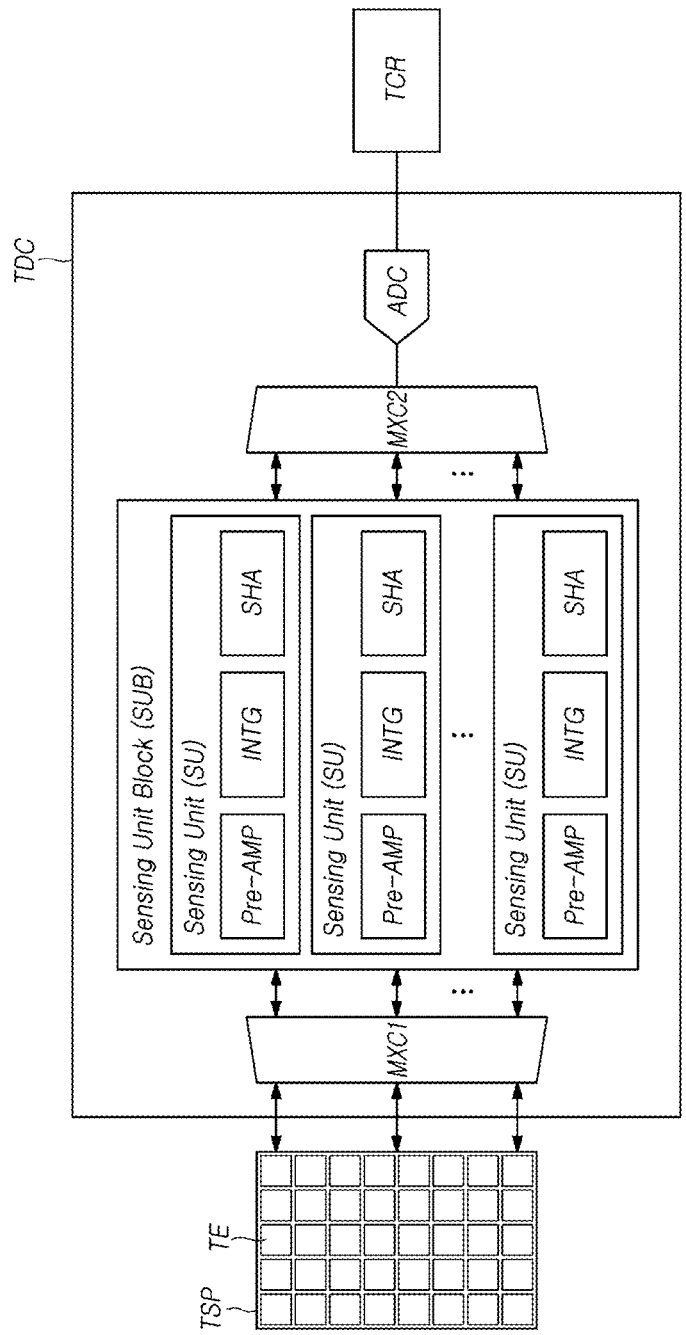
FIG. 5 illustrates a touch-driving circuit according to embodiments of the present disclosure.

FIG. 5 illustrates the touch-driving circuit (TDC) according to embodiments of the present disclosure.

Referring to FIG. 5, the touch-driving circuit (TDC) according to embodiments of the present disclosure may include a first multiplexer circuit (MXC1), a sensing unit block (SUB) including a plurality of sensing units (SU), a second multiplexer circuit (MXC2), and an analog-to-digital converter (ADC).

Each sensing unit (SU) is an element for driving and sensing one touch electrode (TE) to be sensed at one time point, that is, an element for supplying the driving signal to the touch electrodes (TE) to be sensed and detecting the sensing signal from the touch electrode (TE) to be sensed, and may include a pre-amplifier (Pre-AMP), an integrator (INTG), and a sample-and-hold circuit (SHA).

The first multiplexer circuit (MXC1) may include two or more multiplexers. The second multiplexer circuit (MXC2) may include two or more multiplexers.

The first multiplexer circuit (MXC1) may select one or more touch electrodes (TE) to be sensed from among the plurality of touch electrodes (TE).

The number of touch electrodes (TE) to be simultaneously sensed at one time point among all touch electrodes (TE) may correspond to the number of sensing units (SU). That is, the number of touch electrodes (TE) to be simultaneously sensed at one time point may be determined according to the number of sensing units (SU).

The second multiplexer circuit (MXC2) may select one of the plurality of sensing units (SU) included in the sensing unit block (SUB) and connect the selected sensing unit (SU) with the analog-to-digital converter (ADC).

The analog-to-digital converter (ADC) may convert a sensing result for each sensing unit (SU) selected by the second multiplexer circuit (MXC2) into a digital value, collect the values to generate sensing data, and provide the generated sensing data to the touch controller (TCR).

Figure 6:
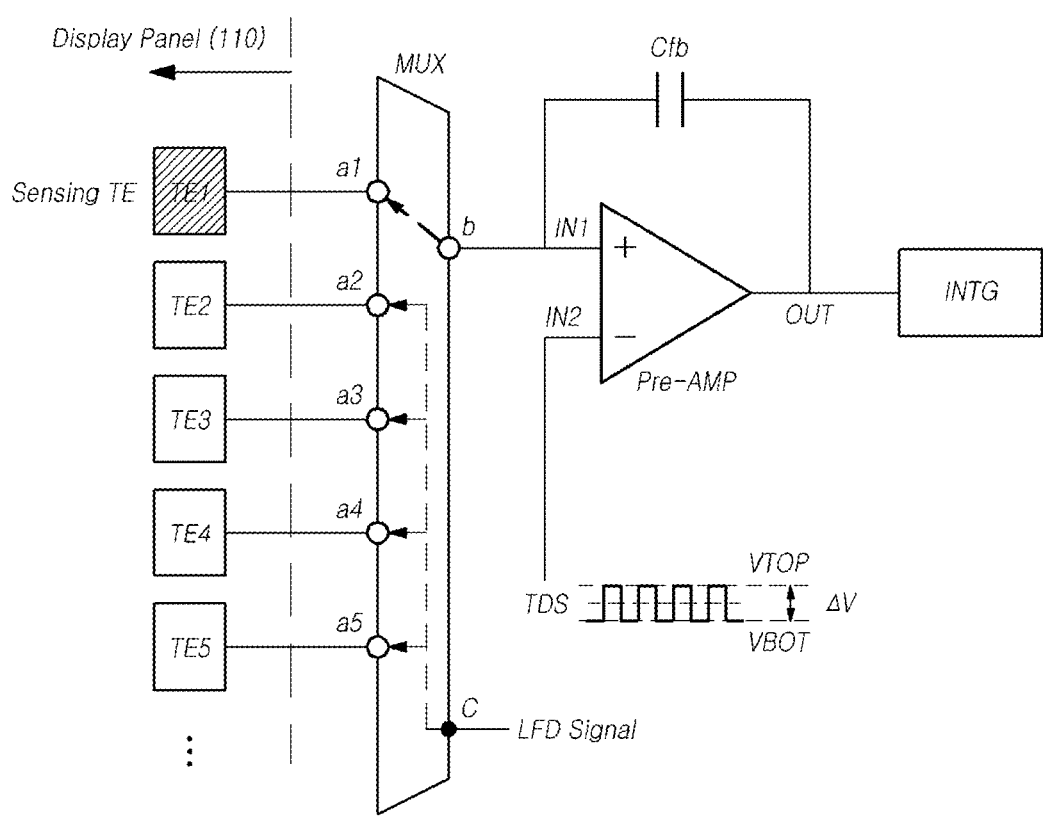
FIG. 6 illustrates a driving operation of a sensing unit within the touch-driving circuit according to embodiments of the present disclosure.

FIG. 6 illustrates a driving operation of the sensing unit (SU) within the touch-driving circuit (TDC) according to embodiments of the present disclosure.

Referring to FIG. 6, one multiplexer (MUX) included in the first multiplexer circuit (MXC1) may sequentially select one touch electrode (TE1) to be sensed from among a plurality of touch electrodes (TE1, TE2, TE3, TE4, TE5 . . . ) corresponding to the first multiplexer circuit (MXC1) and connect the selected touch electrode to the sensing unit (SU).

When a driving signal (TDS) is applied to the one touch electrode (TE1), which is to be sensed, selected by the multiplexer (MUX), an LFD signal may be applied to the remaining touch electrodes (TE2, TE3, TE4, and TE5) which are not sensed. In this case, the driving signal (TDS) and the LFD signal may be the same.

The driving operation of each sensing unit (SU) will be described in more detail.

The pre-amplifier (Pre-AMP) within each sensing unit (SU) may include a first input terminal (IN1) connected to the touch electrode (TE1) to be sensed among the touch electrodes (TE1, TE2, TE3, TE4, TE5 . . . ), a second input terminal (IN2) to which the driving signal (TDS) is input, and an output terminal (OUT) for outputting a signal.

The first input terminal (IN1) is an inverting input terminal, and the second input terminal (IN2) may be a non-inverting input terminal.

A feedback capacitor (Cfb) may be connected between the first input terminal (IN1) and the output terminal (OUT) of the pre-amplifier (Pre-AMP).

The multiplexer (MUX) connects a node (a1) connected to the touch electrode (TE1) to be sensed, which is selected from among nodes (a1, a2, a3, a4, a5, . . . ) connected to the plurality of touch electrodes (TE1, TE2, TE3, TE4, TE5, . . . ) corresponding to the multiplexer (MUX), to a node (b) connected to the sensing unit (SU).

The multiplexer (MUX) connects nodes (a2, a3, a4, a5, . . . ) connected to the touch electrodes (TE2, TE3, TE4, TE5, . . . ) which are not sensed among the nodes (a1, a2, a3, a4, a5, . . . ) connected to the plurality of touch electrodes (TE1, TE2, TE3, TE4, TE5, . . . ) to a node (c) to which the LFD signal is input.

The pre-amplifier (Pre-AMP) outputs the driving signal (TDS) input to the second input terminal (IN2) to the first input terminal (IN1).

The driving signal (TDS) output to the first input terminal (IN1) of the pre-amplifier (Pre-AMP) is applied to the touch electrode (TE1) to be sensed through the multiplexer (MUX).

The pre-amplifier (Pre-AMP) receives the sensing signal from the touch electrode (TE1) to be sensed through the first input terminal (IN1).

The driving signal (TDS) input to the second input terminal (IN2) of the pre-amplifier (Pre-AMP) may be a modulation signal swinging with a predetermined amplitude (ΔV) (for example, a pulse-width-modulation signal).

A voltage level of the driving signal (TDS) may change between a high level (VTOP) and a low level (VBOT) (ΔV=VTOP−VBOT).

The driving signal (TDS) applied to the touch electrode (TE1) to be sensed may be different from or the same as the LFD signal applied to the touch electrodes (TE2, TE3, TE4, TE5, . . . ) which are not sensed.

Further, when the touch electrode (TE) also acts as the common electrode, the driving signal (TDS) may be the common voltage.

Figure 7:
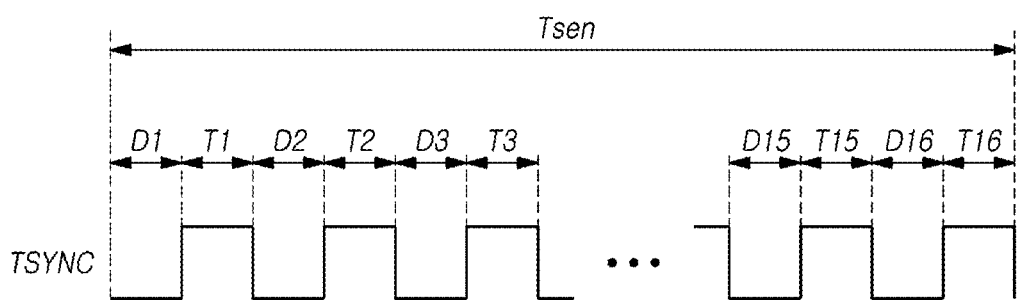
FIG. 7 illustrates driving timing indicating a time-division driving scheme of display driving and touch driving of the touch display device according to embodiments.

FIG. 7 illustrates driving timing indicating a time-division driving scheme of display driving and touch driving of the touch display device according to embodiments.

Referring to FIG. 7, the touch display device 10 according to embodiments of the present disclosure may perform "display driving" for displaying an image and "touch driving (finger-touch driving and/or pen-touch driving)" for sensing a touch by the finger and/or the pen 20 (finger touch and/or pen touch).

Display-driving periods (D1, D2, . . . ) and touch-driving periods (T1, T2, . . . ) are alternately allocated in the touch display device 10.

Display driving may be performed during the display-driving periods (D1, D2, . . . ), and thus the image may be displayed, and touch driving (finger-touch driving and/or pen-touch driving) may be performed during the touch-driving periods (T1, T2, . . . ) and thus the finger touch or the pen touch may be sensed.

In the case of the time-division scheme, the touch-driving periods (T1, T2, . . . ) may be blank periods in which display driving is not performed.

Meanwhile, the touch display device 10 may generate a synchronization signal (TSYNC) swinging between a high level and a low level, and may identify or control the display-driving periods (D1, D2, . . . ) and the touch-driving periods (T1, T2, . . . ) through the synchronization signal (TSYNC). That is, the synchronization signal (TSYNC) is a driving timing control signal that defines the touch-driving periods (T1, T2, . . . ).

For example, a high-level period (or a low-level period) of the synchronization signal (TSYNC) may indicate the touch-driving period (T1, T2, . . . ), and a low-level period (or high-level period) of the synchronization signal (TSYNC) may indicate the display-driving period (D1, D2, . . . ).

Meanwhile, one display frame period may include one display-driving period and one touch-driving period. In this case, touch driving may be performed after one display frame screen is displayed.

Unlike this, one display frame period may include two or more display-driving periods (D1, D2, . . . ) and two or more touch-driving periods (T1, T2, . . . ). In this case, during all periods in which one display frame screen is displayed, touch driving may be performed several times.

For example, referring to FIG. 7, one display frame period may include 16 display-driving periods (D1~D16) and 16 touch-driving periods (T1~T16). In this case, one display frame screen is uniformly divided into 16 periods and displayed, and touch driving may be performed between the periods.

Meanwhile, for example, when whether there is a touch and/or touch coordinates in the entire screen area can be determined after 16 touch-driving periods (T1 to T16) are processed, a touch-sensing time required for touch sensing may correspond to Tsen. Of course, the touch-sensing time required for touch sensing may be a sum of the 16 touch-driving periods (T1 to T16).

Figure 8:
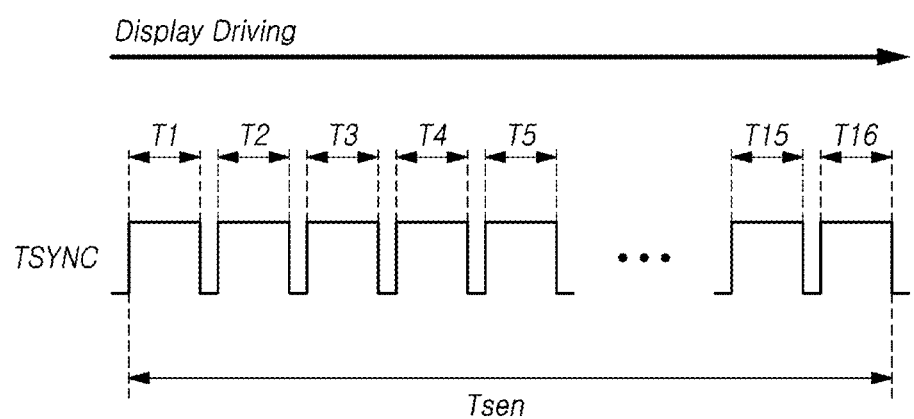
FIG. 8 illustrates driving timing indicating an independent driving scheme of display driving and touch driving of the touch display device according to embodiments of the present disclosure.

FIG. 8 illustrates driving timing indicating an independent driving scheme of display driving and touch driving of the touch display device 10 according to embodiments of the present disclosure.

Referring to FIG. 8, the touch display device 10 according to embodiments of the present disclosure may independently perform "display driving" for displaying an image and "touch driving (finger-touch driving and/or pen-touch driving)" for sensing a touch by the finger and/or the pen 20 (finger touch and/or pen touch).

In this case, display driving and touch driving may be performed in different time periods that are temporally divided, as illustrated in FIG. 7, or in the same time period. Alternatively, the display driving and the touch driving may be performed based on the time-division scheme and then simultaneously performed at certain timing.

When the display driving and the touch driving are independently performed, the touch driving may be performed without consideration of the display driving, or, conversely, the display driving may be performed without consideration of the touch driving.

Display-driving periods (D1, D2, . . . ) and touch-driving periods (T1, T2, . . . ) are alternately allocated in the touch display device 10.

For example, when the display driving and the touch driving are simultaneously performed, the touch driving may be performed while an image is displayed according to the display driving, and thus the finger touch or the pen touch may be sensed.

When the display driving and the touch driving are independently performed, the display-driving period may be controlled by a normal display-driving control signal (for example, a vertical synchronization signal (Vsync)). The touch-driving period may be controlled by the synchronization signal (TSYNC).

In this case, the synchronization signal (TSYNC) may define only the touch-driving periods (T1, T2, . . . ) unlike the synchronization signal (TSYNC) of FIG. 7, which separately defines the display-driving periods (D1, D2, . . . ) and the touch-driving periods (T1, T2, . . . ).

For example, the period in which the synchronization signal (TSYNC) is the high level (or low level) may indicate the touch-driving periods (T1, T2, . . . ) during which the touch driving is performed, and the period in which the synchronization signal (TSYNC) is the low level (or high level) may indicate the period during which the touch driving is not performed.

Meanwhile, during one high-level period (or low-level period) in the synchronization signal (TSYNC), that is, during one touch-driving period, the finger touch and/or the pen touch may be sensed once on the entire screen area. In this case, one touch-driving period may correspond to one touch frame period.

Unlike this, during two or more high-level periods (or low-level periods) in the synchronization signal (TSYNC), that is, two or more touch-driving periods, the finger touch and/or the pen touch may be sensed once on the entire screen area. In this case, two or more touch-driving periods may correspond to one touch frame period.

For example, during 16 high-level periods (or low-level periods) in the synchronization signal (TSYNC), that is, during 16 touch-driving periods, the finger touch and/or the pen touch may be sensed once on the entire screen area. In this case, 16 touch-driving periods may correspond to one touch frame period.

Meanwhile, during each of the touch-driving periods (T1, T2, . . . ), finger-touch driving for sensing the finger touch may be performed and pen-touch driving for sensing the pen touch may be performed.

Further, the touch screen panel (TSP) may be embedded into the display panel 110, or may exist outside the display panel 110. Hereinafter, for convenience of description, an example in which the touch screen panel (TSP) is embedded into the display panel 110 will be described as an example.

Figure 9:
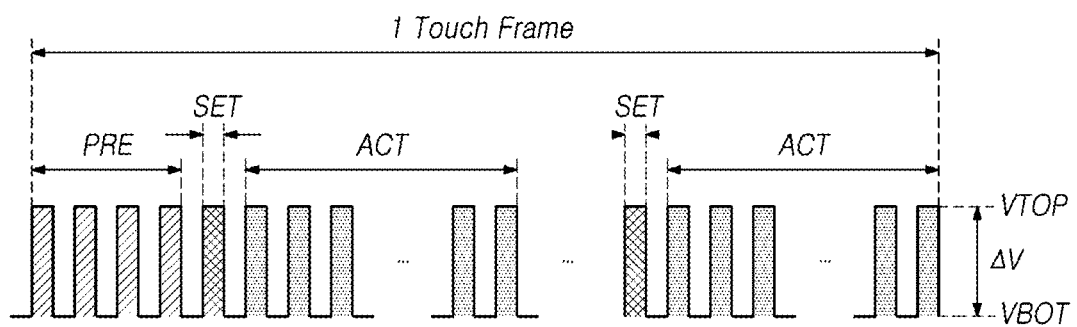
FIG. 9 illustrates a driving signal for touch driving of the touch display device according to embodiments of the present disclosure.

FIG. 9 illustrates the driving signal (TDS) for touch driving of the touch display device 10 according to embodiments of the present disclosure.

Referring to FIG. 9, during a period for sensing all touch electrodes (TE) arranged on the touch screen panel (TSP) according to embodiments of the present disclosure, the driving signal (TDS) supplied to the touch screen panel (TSP) may consist of a plurality of pulses.

During one touch frame period, which is the period during which all touch electrodes (TE) are sensed or the period during which the touch is sensed once on the entire screen area, the driving signal (TDS) supplied to the touch screen panel (TSP) may include one or more presetting pulses of one or more presetting pulse intervals (PRE), one or more setting pulses of one or more setting pulse intervals (SET), and active pulses of one or more active pulse intervals (ACT).

The active pulse interval (ACT) is an interval in which active pulses corresponding to the actual driving signals for touch sensing exist, and corresponds to a pulse period in which the touch-driving circuit (TDC) detects actual signals for touch sensing.

The presetting pulse interval (PRE) is an interval for rapidly making the voltage state of the touch electrodes (TE) a voltage state required for touch driving and touch sensing by applying one or more presetting pulses to the touch electrodes (TE) before touch sensing is started in earnest (that is, before the active pulse period (ACT)).

As the presetting signal is applied in advance to the touch electrodes (TE) before application by the presetting pulse interval (PRE), display-touch crosstalk may be removed or reduced, or a signal delay deviation may be removed or reduced, so that sensing can be stabilized.

Two or more presetting pulse intervals (PRE) may exist during one touch frame period or during two or more touch frame periods.

One setting pulse interval (SET) may exist during every one or more active pulse intervals (ACT). The setting pulse interval (SET) is an interval for rapidly making a voltage state required for touch driving and touch sensing before active pulses are applied to simultaneously sensed touch electrodes (TE) or a group thereof.

Whenever sensing is performed by driving the simultaneously sensed touch electrodes (TE) or the group thereof, a pair of one setting pulse interval (SET) and one active pulse interval (ACT) may exist.

Meanwhile, an amplitude of each of the presetting pulse in the presetting pulse interval (PRE) and the setting pulse in the setting pulse interval (SET) may be the same as an amplitude ($\Delta V = VTOP - VBOT$) of the active pulses in the active pulse interval (ACT), or may be larger than or smaller than the amplitude ($\Delta V = VTOP - VBOT$) of the active pulses in the active pulse interval (ACT).

Meanwhile, frequencies (driving frequencies) in the presetting pulse interval (PRE), the setting pulse interval (SET), and the active pulse interval (ACT) may be the same.

Further, frequencies (driving frequencies) in the presetting pulse interval (PRE), the setting pulse interval (SET), and the active pulse interval (ACT) during a first touch frame period may be different from frequencies (driving frequencies) in the presetting pulse interval (PRE), the setting pulse interval (SET), and the active pulse interval (ACT) during a second touch frame period, which is different from the first touch frame period.

In addition, within one touch frame period, frequencies of a pair of a setting pulse interval (SET) and an active pulse interval (ACT) may be different from frequencies of another pair of a setting pulse interval (SET) and an active pulse interval (ACT).

The driving signal (TDS) may be a modulation signal (for example, a pulse-width-modulation signal) swinging with a predetermined amplitude ($\Delta V$). The voltage level of the driving signal (TDS) may change between a high level (VTOP) and a low level (VBOT) ($\Delta V = VTOP - VBOT$).

Figure 10:
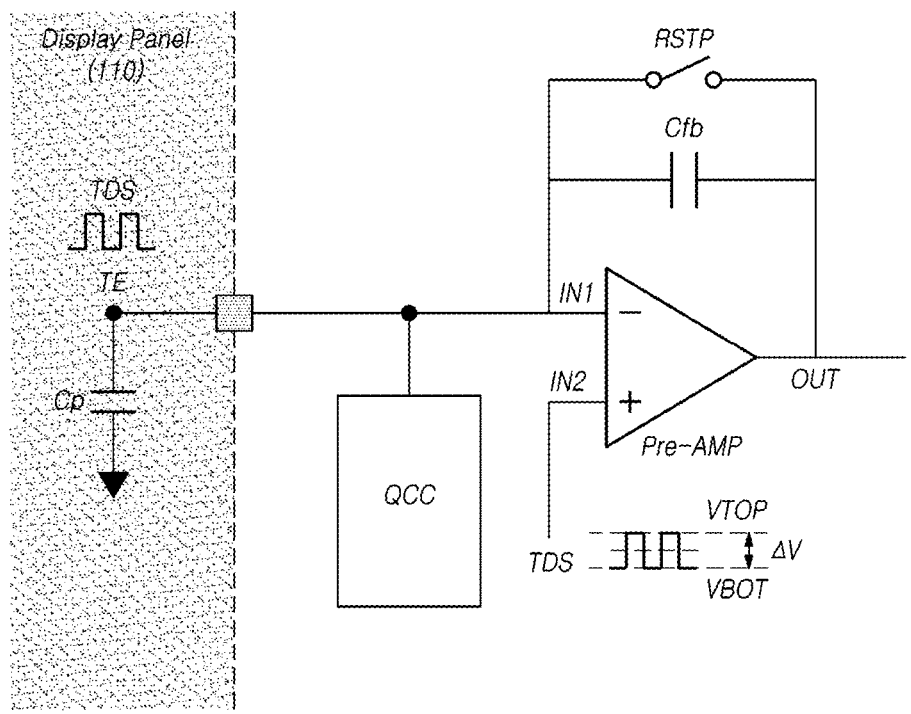
FIG. 10 illustrates a charge control circuit connected to a first input terminal of a pre-amplifier within the touch-driving circuit of the touch display device according to embodiments of the present disclosure.

FIG. 10 illustrates a charge control circuit (QCC) connected to the first input terminal (IN1) of the pre-amplifier (Pre-AMP) within the touch-driving circuit (TDC) of the touch display device 10 according to embodiments of the present disclosure.

The touch display device 10 may include the touch-driving circuit (TDC) for supplying the driving signal (TDS) to the touch screen panel (TSP) and receiving the sensing signal, and each sensing unit (SU) included in the touch-driving circuit (TDC) may include the pre-amplifier (Pre-AMP).

The pre-amplifier (Pre-AMP) may include the first input terminal (IN1), connected to the touch electrode (TE) to be sensed, the second input terminal (IN2), to which the driving signal (TDS) is input, and the output terminal (OUT) for outputting a signal. The first input terminal (IN1) may be an inverting input terminal, and the second input terminal (IN2) may be a non-inverting input terminal.

A feedback capacitor (Cfb) may be connected between the first input terminal (IN1) and the output terminal (OUT) of the pre-amplifier (Pre-AMP). A reset switch (RSTP) may be connected between the first input terminal (IN1) and the output terminal (OUT) of the pre-amplifier (Pre-AMP). The feedback capacitor (Cfb) and the reset switch (RSTP) may be connected in parallel.

Referring to FIG. 10, the touch-driving circuit (TDC) may further include the charge control circuit (QCC), which can be connected to the first input terminal (IN1) of the pre-amplifier (Pre-AMP), which outputs the driving signal (TDS) to the touch electrodes (TE) and receives the sensing signal for the touch electrodes (TE).

The charge control circuit (QCC) is a circuit for controlling a charge amount in the first input terminal (IN1) of the pre-amplifier (Pre-AMP).

The charge control circuit (QCC) may control an output value of the pre-amplifier (Pre-AMP) by putting the charge into the first input terminal (IN1) of the pre-amplifier (Pre-AMP) or extracting the charge from the first input terminal (IN1) of the pre-amplifier (Pre-AMP).

Accordingly, the charge amount corresponding to the sensing signal input to the first input terminal ONO of the pre-amplifier (Pre-AMP) in an on state of the charge control switch (SWCR) may be different from the charge amount corresponding to the sensing signal input to the first input terminal (IN1) of the pre-amplifier (Pre-AMP) in an off state of the charge control switch (SWCR).

The charge control circuit (QCC) may prevent saturation of the sensing value (sensing data) generated by the touch-driving circuit (TDC) by controlling the output value of the pre-amplifier (Pre-AMP).

Therefore, the touch-driving circuit (TDC) enables further increase in the number of integrals through an integrator (INTG). Accordingly, it is possible to acquire a large sensing value (sensing data) and remote a noise component, thereby improving touch sensitivity.

Figure 11:
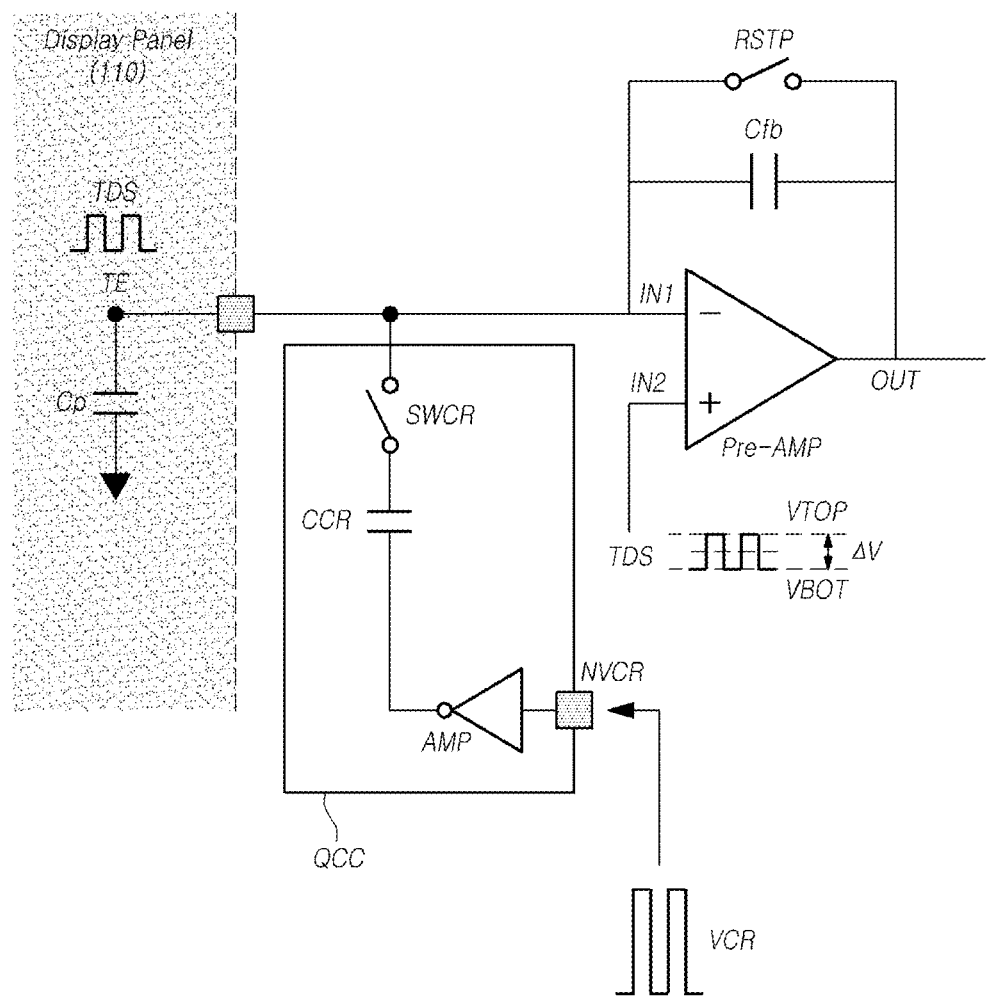
FIG. 11 illustrates an example of a charge control circuit according to embodiments of the present disclosure.
Figure 12:
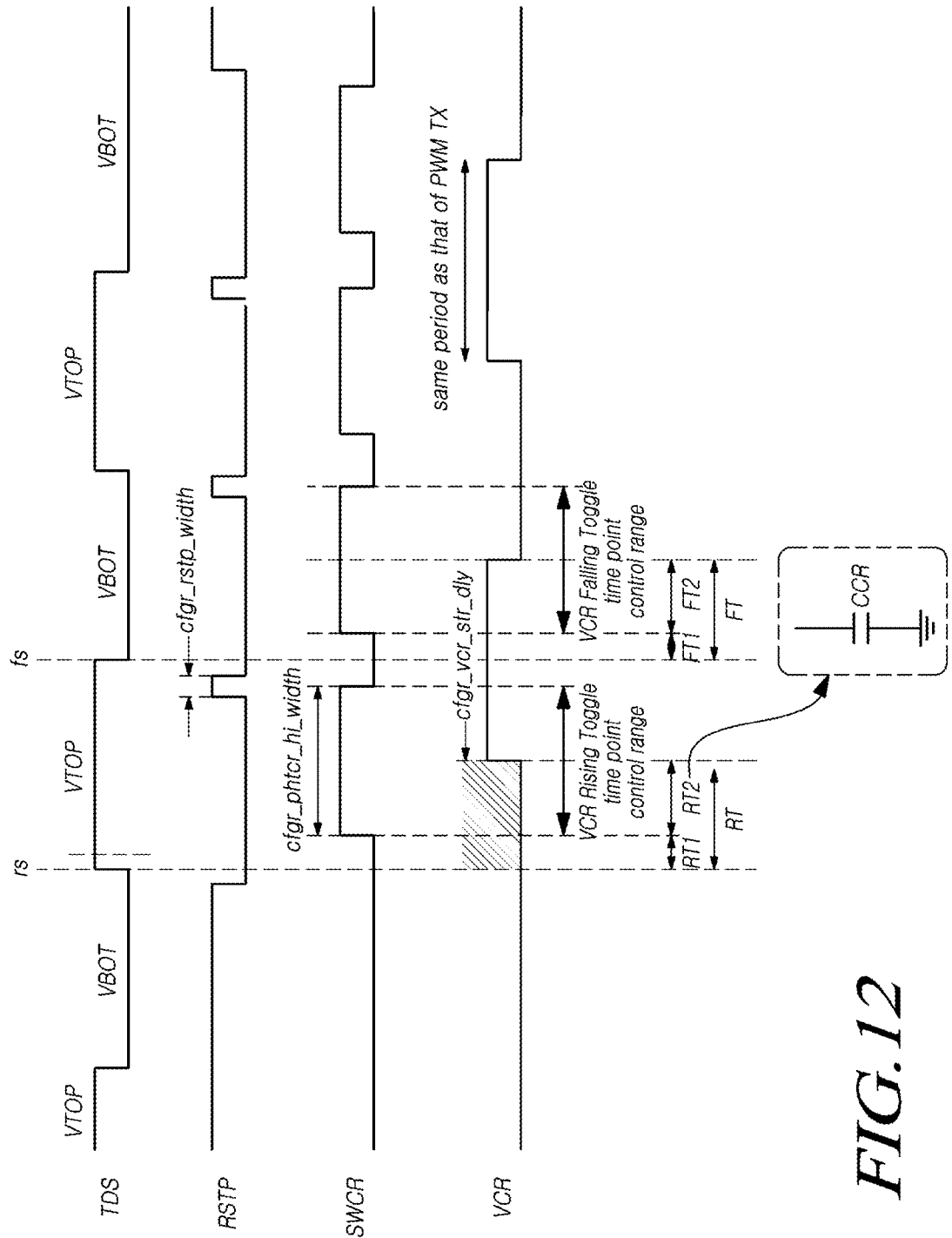
FIG. 12 illustrates driving timing of the charge control circuit according to embodiments of the present disclosure.
Figure 13:
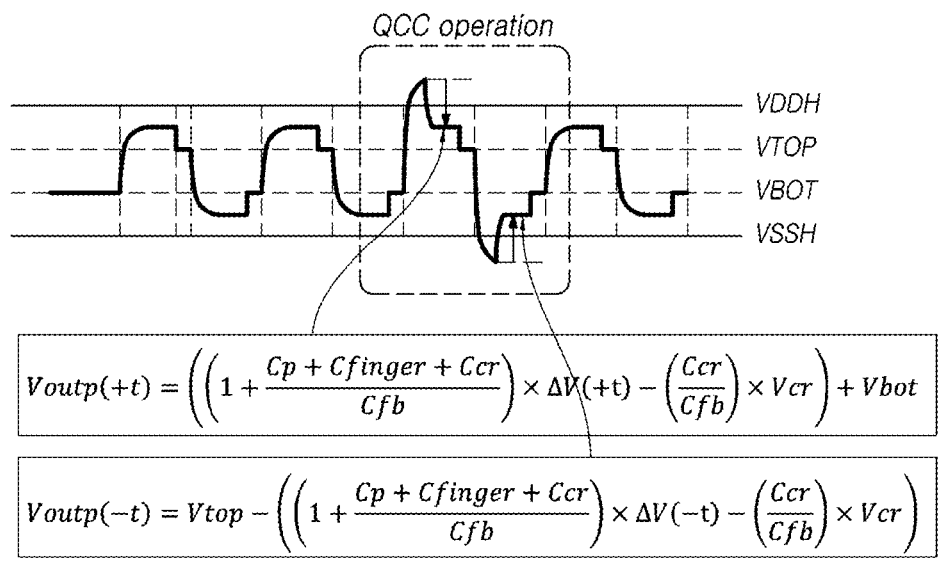
FIG. 13 illustrates output of the pre-amplifier within the touch-driving circuit according to embodiments of the present disclosure.

FIG. 11 illustrates an example of the charge control circuit (QCC) according to embodiments of the present disclosure, and FIG. 12 illustrates driving timing of the charge control circuit (QCC) according to embodiments of the present disclosure. FIG. 13 illustrates output of the pre-amplifier (Pre-AMP) within the touch-driving circuit (TDC) according to embodiments of the present disclosure.

Referring to FIG. 11, the touch-driving circuit (TDC) may include the first input terminal (IN1) of the pre-amplifier (Pre-AMP) and the charge control circuit (QCC) electrically connected between the first input terminal (IN1) and a charge control signal input terminal (NVCR) to which a charge control signal (VCR) is input.

The charge control circuit (QCC) may include a charge control switch (SWCR) and a charge control capacitor (CCR).

The charge control capacitor (CCR) may be connected between the first input terminal (IN1) of the pre-amplifier (Pre-AMP) and the charge control signal input terminal (NVCR) by turning on the charge control switch (SWCR).

The charge control circuit (QCC) may further include an amplifier (AMP) for amplifying the charge control signal (VCR) input into the charge control signal input terminal (NV CR).

Meanwhile, a voltage level change state of the driving signal (TDS) and the charge control signal (VCR) will be described. The voltage level of the driving signal (TDS) may be changed from a first voltage level to a second voltage level or from the second voltage level to the first voltage level. Further, the voltage level of the charge control signal (VCR) may be changed from a third voltage level to a fourth voltage level or from the fourth voltage level to the third voltage level.

For example, the first voltage level and the second voltage level of the driving signal (TDS) may be the low level (VBOT) and the high level (VTOP). Further, the third voltage level and the fourth voltage level of the charge control signal (VCR) may be the low level and the high level.

According to this example, the change in the voltage level of the driving signal (TDS) from the first voltage level to the second voltage level is referred to as "rising", and the change from the second voltage level to the first voltage level is referred to as "falling". Further, the change in the voltage level of the charge control signal (VCR) from the third voltage level to the fourth voltage level is referred to as "rising" and the change from the fourth voltage level to the third voltage level is referred to as "falling".

The low level of the driving signal (TDS) and the low level of the charge control signal (VCR) may be the same voltage value or different voltage values. Further, the high level of the driving signal (TDS) and the high level of the charge control signal (VCR) may be the same voltage value or different voltage values.

Hereinafter, for convenience of description, an example in which the first voltage level and the second voltage level of the driving signal (TDS) are the low level (VBOT) and the high level (VTOP), respectively, and the third voltage level and the fourth voltage level of the charge control signal (VCR) are the low level and the high level, respectively, will be described.

Referring to FIG. 12, the charge control circuit (QCC) may control the charge input to the first input terminal ONO of the pre-amplifier (Pre-AMP) by the turning-on of the charge control switch (SWCR) and the change in the voltage level of the charge control signal (VCR) after a first control time (RT) passes from the time point (rs) at which the change (that is, the increase) in the driving signal (TDS) from the first voltage level, corresponding to the low level (VBOT), to the second voltage level, corresponding to the high level (VTOP), begins.

The charge control signal (VCR) applied to one electrode of the charge control capacitor (CCR) (the electrode connected to the charge control signal input terminal (NVCR), among first and second electrodes of the charge control capacitor (CCR)), which is connected to the first input terminal (IN1) of the pre-amplifier (Pre-AMP) by the charge control switch (SWCR), may be changed from the third voltage level, corresponding to the low level, to the fourth voltage level, corresponding to the high level, after the first control time (RT) passes from the time point (rs) at which the driving signal (TDS) changes from the first voltage level, corresponding to the low level (VBOT), to the second voltage level, corresponding to the high level (VTOP).

Hereinafter, since an example in which the first voltage level and the second voltage level of the driving signal (TDS) are the low level (VBOT) and the high level (VTOP), respectively, will be described, the first control time (RT) is also referred to as a rising control time (RT).

Meanwhile, during the rising control time (RT), the voltage-level-variable slope of the driving signal (TDS) may vary depending on the location of the touch electrode (TE) or a time integer (also referred to as a time constant).

In consideration of this, the rising control time (RT) may be changed according to the location of the touch electrode (TE) or the time integer.

For example, the rising control time (RT) may be set to be longer as the corresponding touch electrode (TE) is located farther away from the touch-driving circuit (TDC) or has a larger time integer.

As described above, by changing the rising timing of the charge control signal (VCR) used for controlling the output of the pre-amplifier (Pre-AMP) by the charge control circuit (QCC) according to the location or the time integer of the touch electrode (TE), it is possible to effectively control a charge control time point in consideration of the characteristics of noise, which is generated differently for each touch electrode (TE).

Meanwhile, referring to FIG. 12, after a second control time (FT) passes from the time point (fs) at which the driving signal (TDS) starts falling from a second voltage level, corresponding to a high level, (VTOP) to a first voltage level, corresponding to a low level (VBOT), the charge control signal (VCR) may fall to the low level. Here, since an example in which the first voltage level and the second voltage level of the driving signal (TDS) are the low level (VBOT) and the high level (VTOP), respectively, is used, a second control time (FT) may be also referred to as a falling control time (FT) hereinafter.

The falling control time (FT) may be changed according to the location or the time integer of the touch electrode (TE).

As described above, by changing the falling timing of the charge control signal (VCR) used for controlling the output of the pre-amplifier (Pre-AMP) by the charge control circuit (QCC) according to the location or the time integer of the touch electrode (TE), it is possible to effectively control a charge control time point in consideration of the characteristics of noise, which is generated differently for each touch electrode (TE).

Hereinafter, the driving operation of the charge control circuit (QCC) will be described in more detail.

After a first rising control time (RT1) passes from the time point (rs) at which the driving signal (TDS) starts rising to the high level (VTOP), the charge control switch (SWCR) may be turned on. At this time, the charge control capacitor (CCR) starts acting.

After a second rising control time (RT2) passes from the time point at which the charge control switch (SWCR) is turned on, the charge control signal (VCR) may rise to the high level. At this time, the charge may be output in a direction from the first input terminal (IN1) of the pre-amplifier (Pre-AMP) to the charge control circuit (QCC).

Meanwhile, before the charge control signal (VCR) rises to the high level, the charge control capacitor (CCR) may be modeled as a ground capacitor.

The sum (RT1+RT2) of the first rising control time (RT1) and the second rising control time (RT2) may correspond to the control time (RT).

The first rising control time (RT1) may be changed according to the location or the time constant of the touch electrode (TE).

A rising toggle time point control range of the charge control signal (VCR) may correspond to a variable range of the length of the second rising control time (RT2).

The variable range of the length of the second rising control time (RT2) may be the period before the charge control switch (SWCR) is turned off after being turned on. That is, the length of the second rising control time (RT2) may be longer than or equal to 0 (zero), and may be equal to or shorter than the period during which the charge control switch (SWCR) maintains an on state.

As described above, by controlling switching timing and rising timing of each of the charge control switch (SWCR) and the charge control signal (VCR) used for controlling the output of the pre-amplifier (Pre-AMP) by the charge control circuit (QCC), it is possible to effectively perform charge control.

Referring to FIG. 12, after the charge control signal (VCR) rises, the charge control switch (SWCR) may be turned off.

After a first falling control time (FT1) passes after the time point at which the driving signal (TDS) starts falling to the low level, the charge control switch (SWCR) may be turned on.

After a second falling control time (FT2) passes after the time point at which the charge control switch (SWCR) is turned on, the charge control signal (VCR) may fall to the low level. At this time, a charge may further flow into the first input terminal (IN1) of the pre-amplifier (Pre-AMP).

The sum (FT1+FT2) of the first falling control time (FT1) and the second falling control time (FT1) may correspond to the falling control time (FT).

The first falling control time (FT1) may be changed according to the location or the time integer of the touch electrode (TE).

A falling toggle time point control range of the charge control signal (VCR) may correspond to a variable range of the length of the second falling control time (FT2).

The variable range of the length of the second falling control time (FT2) may be a period before the charge control switch (SWCR) is turned off after being turned on. That is, the length of the second falling control time (FT2) may be long than or equal to 0 (zero) and equal to or shorter than the length of the period during which the charge control switch (SWCR) maintains an on state.

As described above, by controlling switching timing and falling timing of each of the charge control switch (SWCR) and the charge control signal (VCR) used for controlling the output of the pre-amplifier (Pre-AMP) by the charge control circuit (QCC), it is possible to effectively perform charge control.

Meanwhile, an ideal transfer function of the pre-amplifier (Pre-AMP) is shown as Equation (1) below.

$$Voutp = \left( \left(1 + \frac{Cp + Cfinger}{Cfb}\right) \times \Delta V - \left(\frac{Ccr}{Cfb}\right) \times Vcr \right) + Vref \quad \text{Equation (1)}$$

In Equation (1) above, Voutp denotes the output of the pre-amplifier (Pre-AMP), Cp denotes the parasitic capacitance generated in connection with the touch electrode (TE), Cfinger denotes the capacitance generated between the touch electrode (TE) and the finger, Cfb denotes feedback capacitance, Ccr denotes the capacitance of the charge control capacitance (CCR), Vcr denotes the voltage of the charge control signal (VCR), Vref denotes a reference voltage, and ΔV denotes an amplitude of the driving signal (TDS).

If the amplitude (ΔV) of the driving signal (TDS) is not consistent due to the generation of noise, the transfer function of the pre-amplifier (Pre-AMP) may be as shown in Equation (2) below.

$$Voutp(t) = \left(\left(1 + \frac{Cp + Cfinger + Ccr}{Cfb}\right) \times \Delta V(t) - \left(\frac{Ccr}{Cfb}\right) \times Vcr\right) + Vref \quad \text{Equation (2)}$$

In Equation (2) above, Voutp(t) denotes the output of the pre-amplifier (Pre-AMP) according to time, Cp denotes the parasitic capacitance generated in connection with the touch electrode (TE), Cfinger denotes the capacitance generated between the touch electrode (TE) and the finger, Cfb denotes feedback capacitance, Ccr denotes capacitance of the charge control capacitor (CCR), Vcr denotes the voltage of the charge control signal (VCR), Vref denotes a reference voltage, and ΔV(t) denotes the amplitude of the driving signal (TDS) according to time.

Referring to FIG. 13, the output voltage of the pre-amplifier (Pre-AMP) may be controlled to be between a maximum voltage value (VDDH) and a minimum voltage value (VSSH) by the charge control operation of the charge control circuit (QCC). The controlled output voltage of the pre-amplifier (Pre-AMP) is as shown in Equation (3) below.

$$Voutp(+t) = \left(\left(1 + \frac{Cp + Cfinger + Ccr}{Cfb}\right) \times \Delta V(+t) - \left(\frac{Ccr}{Cfb}\right) \times Vcr\right) + Vbot \quad \text{Equation (3)}$$

$$Voutp(-t) = Vtop - \left(\left(1 + \frac{Cp + Cfinger + Ccr}{Cfb}\right) \times \Delta V(-t) - \left(\frac{Ccr}{Cfb}\right) \times Vcr\right)$$

In Equation (3), Voutp(+t) denotes an output voltage that is controlled to be smaller than the maximum voltage value (VDDH) by the charge control operation of the charge control circuit (QCC) and Voutp(−t) denotes an output voltage that is controlled to be larger than the minimum voltage value (VSSH) by the charge control operation of the charge control circuit (QCC).

By the control of the output voltage, saturation of the sensing value (sensing data) generated by the touch-driving circuit (TDC) may be prevented.

Figure 14:
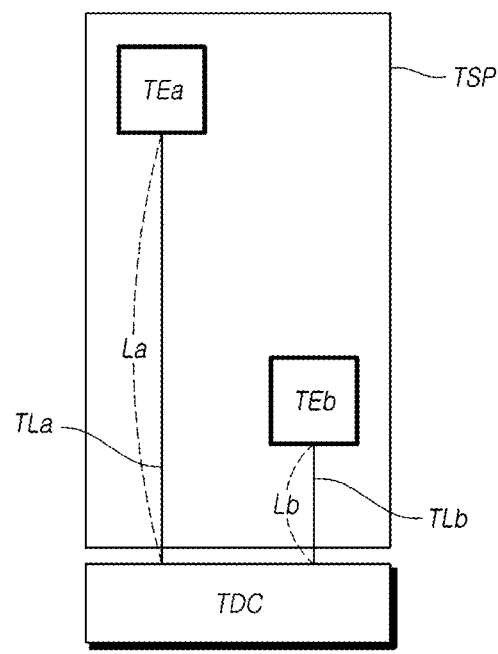
FIG. 14 illustrates two touch electrodes which are arranged on the touch screen panel of the touch display device and have different time constants according to embodiments of the present disclosure.
Figure 15:
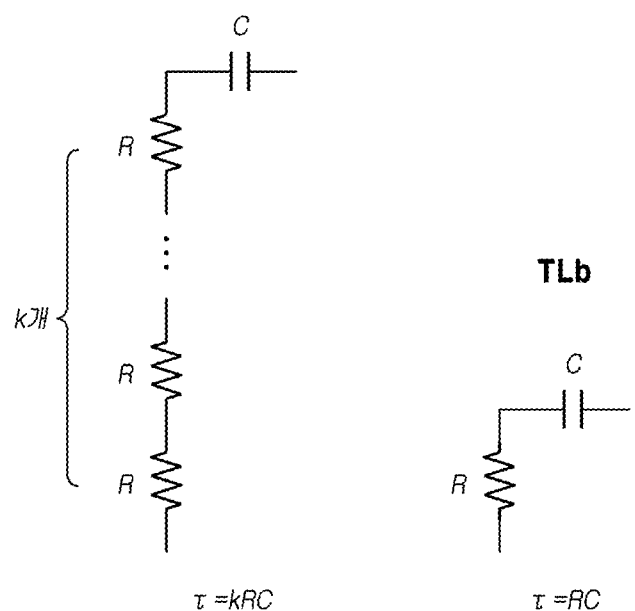
FIG. 15 illustrates time constants of two touch electrodes arranged on the touch screen panel of the touch display device as RC delay according to embodiments of the present disclosure.

FIG. 14 illustrates two touch electrodes (TEa and TEb) which are arranged on the touch screen panel (TSP) of the touch display device 10 according to embodiments of the present disclosure and have different time integers, and FIG. 15 illustrates the time constants of the two touch electrodes (TEa and TEb) arranged on the touch screen panel (TSP) of the touch display device 10 according to embodiments of the present disclosure through an RC delay.

Referring to FIG. 14, a plurality of touch electrodes (TE) arranged on the touch panel (TSP) may include a first touch electrode (TEa) and a second touch electrode (TEb).

The first touch electrode (TEa) represents touch electrodes having a relatively large time integer(τ) compared to the second touch electrode (TEb). In contrast, the second touch electrode (TEb) represents touch electrodes having a relatively small time integer (τ) compared to the first touch electrode (TEa).

The effective length (Lb) of a path (TLb) through which the driving signal (TDS) is transferred from the touch-driving circuit (TDC) to the second touch electrode (TEb) may be relatively shorter than the effective length (La) of a path (TLa) through which the driving signal (TDS) is transferred from the touch-driving circuit (TDC) to the first touch electrode (TEa).

The path (TLa) through which the driving signal (TDS) output from the touch-driving circuit (TDC) is transferred to the first touch electrode (TEa) may include not only a touch line (TL) that connects the touch-driving circuit (TDC) and the first touch electrode (TEa) but also all patterns and pads electrically connected thereto. The path (TLb) through which the driving signal (TDS) output from the touch-driving circuit (TDC) is transferred to the second touch electrode (TEb) conceptually include not only a touch line (TL) that connects the touch-driving circuit (TDC) and the second touch electrode (TEb) but also all patterns and pads electrically connected thereto.

The effective lengths (La and Lb) conceptually include not only the physical length of the touch line (TL) but also a circuit element that interrupts signal transfer.

The first touch electrode (TEa) is a touch electrode having a relatively large time integer (τ) compared to the second touch electrode (TEb), and in this case, the first touch electrode (TEa) may generally be located farther away from the touch-driving circuit (TDC) than the second touch electrode (TEb).

Hereinafter, the above-mentioned time integer (τ) will be described.

The time integer (τ) is an index indicating how fast or slow each touch electrode (TEa or TEb) reacts with respect to the supplied driving signal (TDS), and is also referred to as a time constant.

In other words, when the driving signal (TDS), which is a voltage signal of which the voltage level is variable, is applied to each touch electrode (TEa or TEb), and the voltage level of the driving signal (TDS) changes from the low voltage level to the high voltage level, the current or voltage gradually increases and reaches a predetermined value (for example, 63.2% of the normal value) compared to the normal value (high level voltage), and at this time, the increase rate of the current or voltage refers to the time integer (τ).

Further, when the driving signal (TDS), which is the voltage signal of which the voltage level is variable, is applied to each touch electrode (TEa or TEb) and the voltage level of the driving signal (TDS) changes from the high voltage level to the low voltage level, the current or voltage gradually decreases and reaches a predetermined value (for example, 36.8% of the normal value) compared to the normal value (low voltage level), and at this time, the decrease rate of the current or voltage refers to the time integer (τ).

As described above, the time integer (τ) is a constant indicating a rate of change of a transient phenomenon of the circuit including each touch electrode (TEa or TEb) when the driving signal (TDS) is applied to each touch electrode (TEa or TEb), for example, an RC delay (R: resistance value, C: capacitance). R (the resistance value) may be a resistance value of a path (circuit) through which the driving signal (TDS) is transferred from the touch-driving circuit (TDC) to each touch electrode (TEa or TEb), and C (capacitance) may be the capacitance generated in a circuit (including the touch electrode (TE)) through which the driving signal (TDS) is transferred from the touch-driving circuit (TDC) to each touch electrode (TEa or TEb).

Referring to the example of FIG. 15, the circuit including the first touch electrode (TEa) and the touch-driving circuit (TDC) may correspond to an equivalent circuit in which k resistors (k being a natural number larger than or equal to 2) having the resistance value R and one capacitor having capacitance C exist. In this case, the RC delay corresponding to the time integer of the first touch electrode (TEa) may be kRC.

Referring to the example of FIG. 15, the circuit including the second touch electrode (TEb) and the touch-driving circuit (TDC) may correspond to an equivalent circuit in which one resistor having the resistance value R and one capacitor having capacitance C exist. In this case, the RC delay corresponding to the time integer of the second touch electrode (TEb) may be RC.

Figure 16:
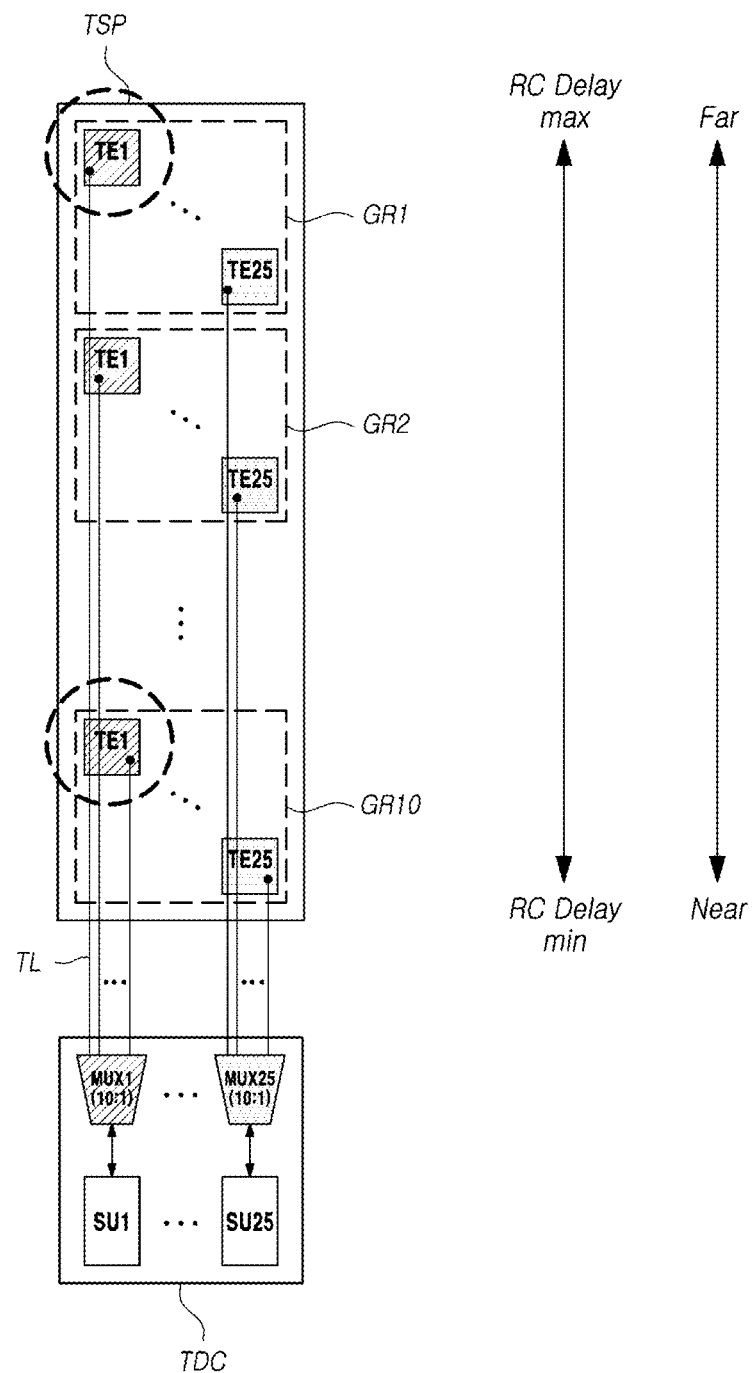
FIG. 16 illustrates a multiplexer driving scheme of a plurality of touch electrodes arranged on the touch screen panel of the touch display device and a time constant difference and a location difference for each sensing group in multiplexer driving according to embodiments of the present disclosure.

FIG. 16 illustrates a multiplexer driving scheme of a plurality of touch electrodes (TE) arranged on the touch screen panel (TSP) of the touch display device 10 according to embodiments of the present disclosure, and a time integer difference and a location difference for each sensing group in multiplexer driving.

According to the example of FIG. 16, 250 touch electrodes (TE) may be arranged on the touch panel (TSP). The touch-driving circuit (TDC) may include 25 multiplexers (MUX1 to MUIX25) and 25 sensing units (SU1 to SU25) corresponding to the 25 multiplexers (MUX1 to MUIX25).

The 25 multiplexers (MUX1 to MUIX25) constitute the first multiplexer circuit (MXC1) of FIG. 5. The 25 sensing units (SU1 to SU25) are sensing units included in the sensing unit block of FIG. 5.

For example, each of the 25 multiplexers (MUX1 to MUIX25) may be a 10:1 multiplexer. Accordingly, each of the 25 multiplexers (MUX1 to MUIX25) select one of the 10 touch electrodes and connect the selected touch electrode to the corresponding sensing unit.

Among the 250 touch electrodes (TE), touch electrodes that can be simultaneously sensed may be grouped. The 250 touch electrodes (TE) may be classified into 10 sensing groups (GR1 to GR10) including 25 touch electrodes (TE1 to TE25).

The 25 touch electrodes (TE1 to TE25) included in each of the 10 sensing groups (GR1 to GR10) may be simultaneously sensed. The 10 sensing groups (GR1 to GR10) may be sequentially sensed.

The 25 touch electrodes (TE1 to TE25) included in each of the 10 sensing groups (GR1 to GR10) may be connected to correspond to the 25 multiplexers (MUX1 to MUIX25).

Every TE1 included in each of the 10 sensing groups (GR1 to GR10) may be connected to MUX1. Every TE2 included in each of the 10 sensing groups (GR1 to GR10) may be connected to MUX2. In this way, the 25 touch electrodes (TE1 to TE25) included in each of the 10 sensing groups (GR1 to GR10) may be connected to correspond to the 25 multiplexers (MUX1 to MUIX25). Every TEi (i=1 to 25) included in each of the 10 sensing groups (GR1 to GR10) may be connected to MUXi (i=1 to 25).

A multiplexer driving scheme using the above-described structure is described below.

In the touch-driving circuit (TDC), the 25 sensing units (SU1 to SU25) sense the first sensing group (GR1) by simultaneously supplying the driving signal (TDS) to the 25 touch electrodes (TE1 to TE25) included in the first sensing group (GR1) among the 10 sensing groups (GR1 to GR10) through the 25 multiplexers (MUX1 to MUIX25) and receiving a touch-sensing signal.

Thereafter, in the touch-driving circuit (TDC), the 25 sensing units (SU1 to SU25) sense the second sensing group (GR2) by simultaneously supplying the driving signal (TDS) to the 25 touch electrodes (TE1 to TE25) included in the second sensing group (GR2) among the 10 sensing groups (GR1 to GR10) through the 25 multiplexers (MUX1 to MUIX25) and receiving a touch-sensing signal.

Thereafter, in the touch-driving circuit (TDC), the 25 sensing units (SU1 to SU25) sense the third sensing group (GR3) by simultaneously supplying to the driving signal (TDS) to the 25 touch electrodes (TE1 to TE25) included in the third sensing group (GR3) among the 10 sensing groups (GR1 to GR10) through the 25 multiplexers (MUX1 to MUIX25) and receiving a touch-sensing signal.

In this way, in the touch-driving circuit (TDC), the 25 sensing units (SU1 to SU25) sense the fourth sensing group (GR4) to the tenth sensing group (GR10). Accordingly, the 250 touch electrodes arranged on the touch panel (TSP) are all sensed.

Among the 10 sensing groups (GR1 to GR10), the 25 touch electrodes (TE1 to TE25) included in the first sensing group (GR1) may have the largest time integer ($\tau$), and the 25 touch electrodes (TE1 to TE25) included in the tenth sensing group (GR10) may have the smallest time integer ($\tau$).

That is, the time integer ($\tau$) may become smaller in the order from the first sensing group (GR1) to the tenth sensing group (GR10). The time integer ($\tau$) may become larger in the order from the tenth sensing group (GR10) to the first sensing group (GR1).

Further, the RC delay (10RC) of the 25 touch electrodes (TE1 to TE25) included in the first sensing group (GR1) among the 10 sensing groups (GR1 to GR10) may be the largest, and the RC delay (RC) of the 25 touch electrodes (TE1 to TE25) included in the tenth sensing group (GR10) may be the smallest.

That is, the RC delay may become smaller in the order from the first sensing group (GR1) to the tenth sensing group (GR10). The RC delay may become larger in the order from the tenth sensing group (GR10) to the first sensing group (GR1).

Further, the 25 touch electrodes (TE1 to TE25) included in the first sensing group (GR1), among the 10 sensing groups (GR1 to GR10), may be farthest from the touch-driving circuit (TDC), and the 25 touch electrodes (TE1 to TE25) included in the tenth sensing group (GR10) may be closest to the touch-driving circuit (TDC).

That is, the touch electrodes become closer to the touch-driving circuit (TDC) in order from the first sensing group (GR1) to the tenth sensing group (GR10), and the touch electrodes become farther from the touch-driving circuit (TDC) in order from the tenth sensing group (GR10) to the first sensing group (GR1).

Figure 17:
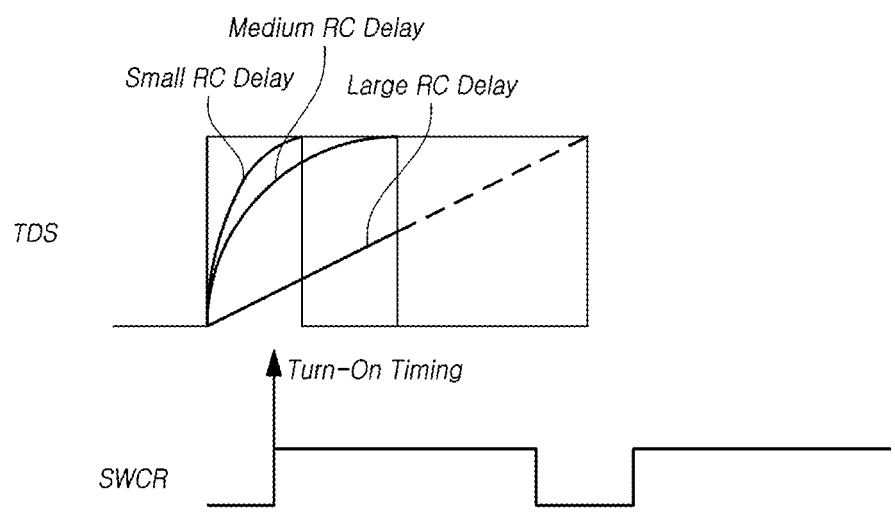
FIG. 17 illustrates a difference in a rising state of the driving signal for each touch electrode and a switching operation of a charge control switch within the charge control circuit in the touch display device according to embodiments of the present disclosure.

FIG. 17 illustrates a difference of a rising state of the driving signal (TDS) for each touch electrode (TE) and a switching operation of a charge control switch (SWCR) within a charge control circuit (QCC) in the touch display device 10 according to embodiments of the present disclosure.

As described with reference to FIGS. 14 to 16, a difference in the time integer may occur due to the location difference in the touch electrode. Accordingly, as illustrated in FIG. 17, voltage level change slopes of the applied driving signal (TDS) may vary depending on the touch electrode.

When the charge control is performed at the same time point in spite of the difference in the location and the time integer for each touch electrode, the touch electrode (TE) having the larger time integer (RC delay) is significantly influenced by noise. Accordingly, touch sensitivity may significantly decrease.

For example, when the charge control switch (SWCR) is turned on at the same time point in spite of the difference in the location and the time integer for each touch electrode, the touch electrode (TE) having the larger time integer (RC delay) is significantly influenced by noise. Accordingly, touch sensitivity may significantly decrease.

Figure 18:
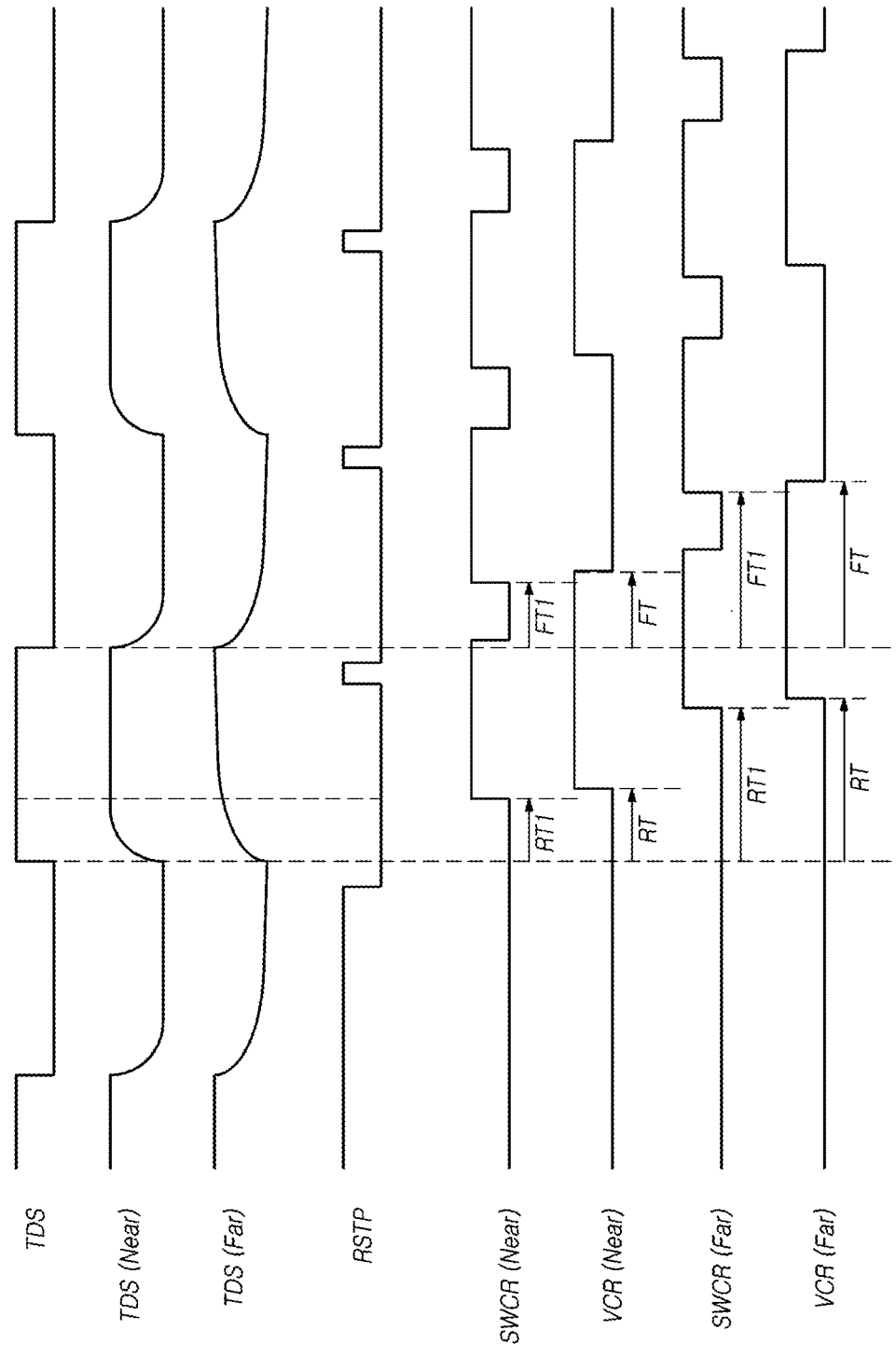
FIG. 18 illustrates a driving timing of the charge control circuit when each of a far first touch electrode and a near second touch electrode is driven according to embodiments of the present disclosure.

FIG. 18 illustrates driving timing of the charge control circuit (QCC) according to embodiments of the present disclosure when each of a far touch electrode (Far TE) and a near touch electrode (Near TE) is driven.

Referring to FIG. 18, a driving signal (TDS) applied to the touch electrode (TE) located close to the touch-driving circuit (TDC) and a driving signal (TDS) applied to the touch electrode (TE) located far from the touch-driving circuit (TDC) may have different voltage level change slopes due to the time integer difference.

In consideration of the difference in the location and the time integer for each touch electrode, a rising control time (RT) of the charge control signal (VCR) may be set to be longer as the corresponding touch electrode (TE) is located farther from the touch-driving circuit (TDC) or has a larger time integer.

In contrast, the rising control time (RT) of the charge control signal (VCR) may be set to be shorter as the corresponding touch electrode (TE) is located closer to the touch-driving circuit (TDC) or has a smaller time integer.

In consideration of the difference in the location and the time integer for each touch electrode, a first rising control time (RT1) related to turn-on timing of the charge control switch (SWCR) may be set to be longer as the corresponding touch electrode (TE) is located farther from the touch-driving circuit (TDC) or has a larger time integer.

In contrast, the first rising control time (RT1) related to turn-on timing of the charge control switch (SWCR) may be set to be shorter as the corresponding touch electrode (TE) is located closer to the touch-driving circuit (TDC) or has a smaller time integer.

Further, in consideration of the difference in the location and the time integer for each touch electrode, a falling control time (FT) of the charge control signal (VCR) may be set to be longer as the touch electrode (TE) is located farther from the touch-driving circuit (TDC) or has a larger time integer.

In contrast, the falling control time (FT) of the charge control signal (VCR) may be set to be shorter as the touch electrode (TE) is located closer to the touch-driving circuit (TDC) or has a smaller time integer.

In consideration of the difference in the location and the time integer for each touch electrode, a first falling control time (FT1) related to turn-on timing of the charge control switch (SWCR) may be set to be longer as the corresponding touch electrode (TE) is located farther from the touch-driving circuit (TDC) or has a larger time integer.

In contrast, the first falling control time (FT1) related to turn-on timing of the charge control switch (SWCR) may be set to be shorter as the corresponding touch electrode (TE) is located closer to the touch-driving circuit (TDC) or has a smaller time integer.

As described above, in consideration of the difference in the location and the time integer for each touch electrode, an effective charge control time point may be controlled.

Figure 19:
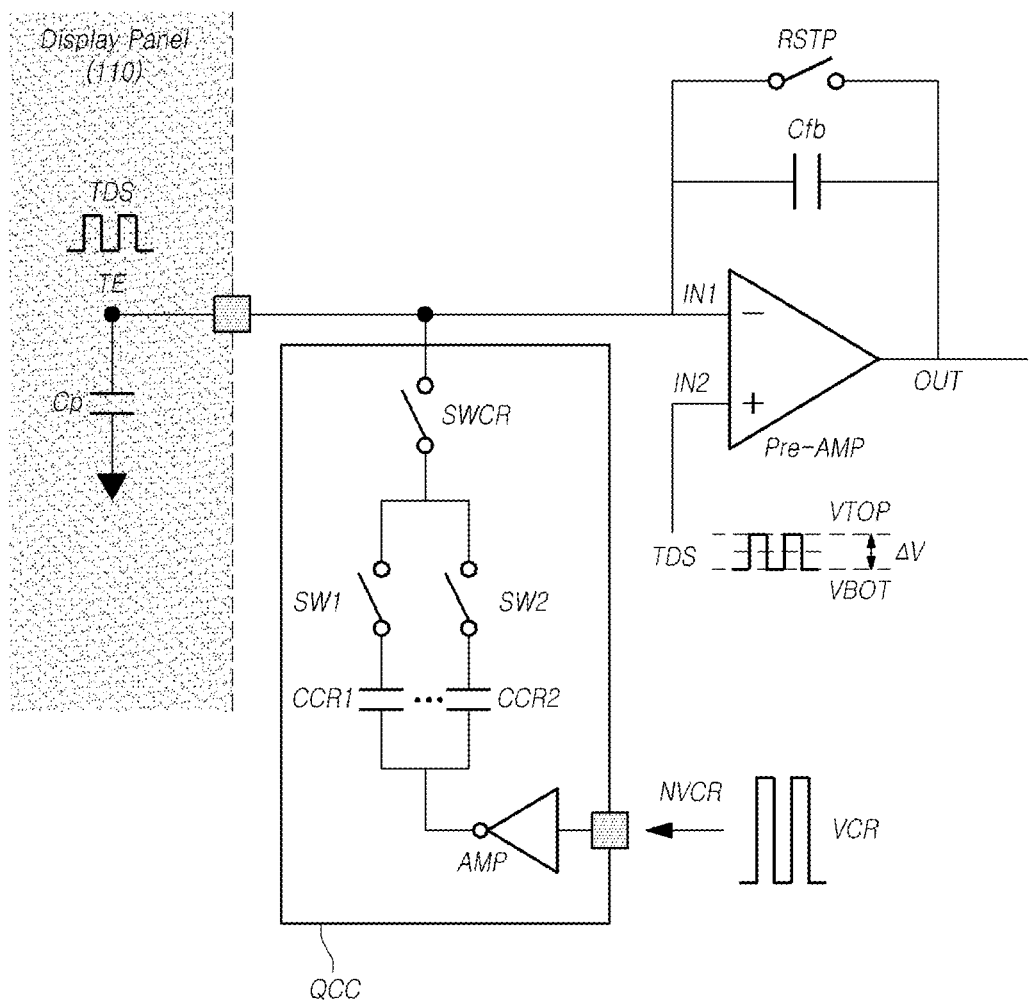
FIG. 19 illustrates another example of the charge control circuit according to embodiments of the present disclosure.

FIG. 19 illustrates another example of the charge control circuit (QCC) according to embodiments of the present disclosure.

As illustrated in FIG. 11, the charge control circuit (QCC) may include one charge control capacitor (CCR).

Unlike this, as illustrated in FIG. 19, the charge control circuit (QCC) may include two or more charge control capacitors (CCR1 and CCR2).

For example, the charge control circuit (QCC) may include the first charge control capacitor (CCR1) and the second charge control capacitor (CCR2).

The first charge control capacitor (CCR1) and the second charge control capacitor (CCR2) may be connected in parallel. That is, first electrodes of the first charge control capacitor (CCR1) and the second charge control capacitor (CCR2) may be connected to each other. Second electrodes of the first charge control capacitor (CCR1) and the second charge control capacitor (CCR2) may be connected to each other.

The charge control circuit (QCC) may further include a first selection switch (SW1) for connecting the first electrode of the first charge control capacitor (CCR1) and the charge control switch (SWCR) and a second selection switch (SW2) for connecting the first electrode of the second charge control capacitor (CCR2) and the charge control switch (SWCR).

As described above, it is possible to perform more precise charge control by preparing two or more charge control capacitors (CCR1 and CCR2) and selecting one or more of the two or more charge control capacitors (CCR1 and CCR2) through two or more selection switches (SW1 and SW2) to use the selected charge control capacitor for the charge control.

Figure 20:
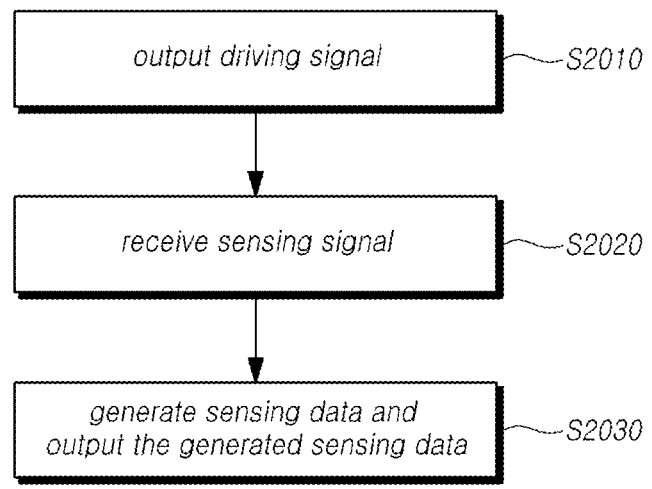
FIG. 20 is a flowchart illustrating a touch-sensing method according to embodiments of the present disclosure.

FIG. 20 is a flowchart illustrating a touch-sensing method according to embodiments of the present disclosure.

Referring to FIG. 20, the touch-sensing method according to embodiments of the present disclosure may include step S2010, in which a touch-driving circuit (TDC) outputs a driving signal (TDS) to touch electrodes (TE), step S2020, in which the touch-driving circuit (TDC) receives a sensing signal from the touch electrodes (TE), and step S2030, in which the touch-driving circuit (TDC) generates sensing data based on the sensing signal and outputs the generated sensing data.

After a first time (RT1) passes from the time point at which the driving signal starts changing from a first voltage level (for example, a low level) to a second voltage level (for example, a high level), a charge control capacitor (CCR) may be connected between a first input terminal (IN1), to which the sensing signal is input in the touch-driving circuit (TDC), and a charge control signal input terminal (NVCR), to which the driving signal (TDS) and another charge control signal (VCR) are input in the touch-driving circuit (TDC) in step S2010.

In step S2010, the charge control signal (VCR) changed from a third voltage level (for example, a low level) to a fourth voltage level (for example, a high level) may be applied to one electrode (an electrode connected to a charge control signal input terminal NVCR node among first and second electrodes of CCR) of the charge capacitor (CCR).

A first time (RT1) may be changed according to a location or a time integer of the touch electrode (TE).

The first time (RT1) may be set to be longer as the touch electrode (TE) is located farther from the touch-driving circuit (TDC) or has a larger time integer.

Figure 21:
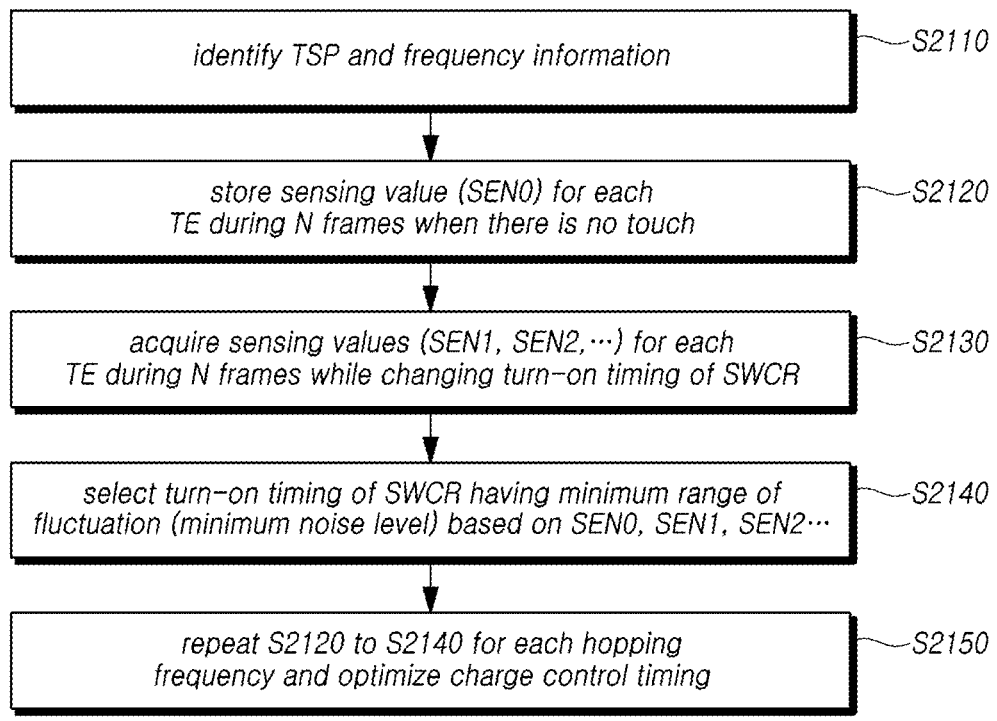
FIGS. 21 and 22 are flowcharts illustrating a method of controlling charge control timing according to embodiments of the present disclosure.
Figure 22:
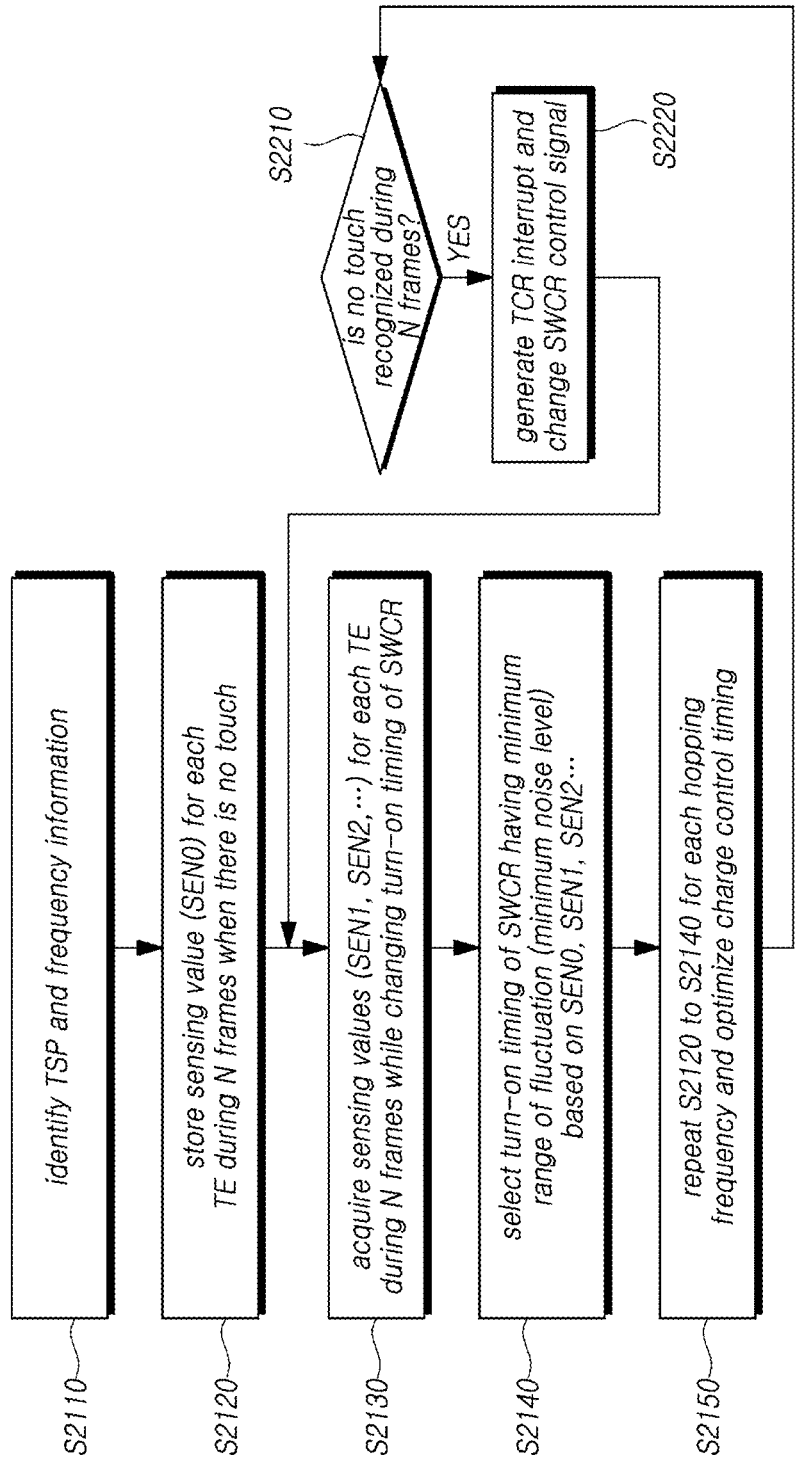

FIGS. 21 and 22 are flowcharts illustrating a method of controlling charge control timing according to embodiments of the present disclosure.

Referring to FIG. 21, in order to control the charge control timing by the charge control circuit (QCC), the touch display device 10 first identifies the touch screen panel (TSP) and frequency information in S2110.

In step S2110, information on a difference in the location or the time integer between a plurality of touch electrodes (TE) arranged on the touch screen panel (TSP) may be identified. Further, the frequency of the driving signal (TDS) may be identified.

In an environment in which there is no touch, the touch display device 10 acquires and stores a sensing value (SEN0) for each touch electrode during N frames (touch frames) in S2120.

Thereafter, while changing turn-on timing of the charge control switch (SWCR), the touch display device 10 acquires and stores sensing values (SEN1, SEN2, ...) for each touch electrode during N frames (touch frames) for each timing in S2130.

The touch display device 10 compares sensing values (SEN0, SEN1, SEN2, ...) for each touch electrode stored in steps S2120 and S2130 and selects turn-on timing of the charge control switch (SWCR) for minimum range of fluctuation among the sensing values (SEN0, SEN1, SEN2, ...) for each touch electrode in S2140.

The touch display device 10 determines optimal turn-on timing of the charge control switch (SWCR) by repeatedly performing steps S2120 to S21040 according to each variable frequency (hopping frequency) and finally determines charge control timing including the switching operation of the charge control switch (SWCR) and application timing (voltage level change timing) of the charge control signal (VCR) based on the determined optimal turn-on timing.

Meanwhile, as illustrated in FIG. 22, after storing in advance the sensing value (SEN0) for each touch electrode during N frames (touch frames) in an environment in which there is no touch in step S2120, when the touch display device 10 determines whether the situation in which there is no touch during N frames occurs in S2210 during the operation in S2210 and it is determined that the corresponding situation occurs, the touch controller (TCR) generates an interrupt in the touch-driving circuit (TDC) and changes a control signal for controlling the charge control switch (SWCR) in S2220. Thereafter, steps from S2130 may be repeatedly performed.

The above-described embodiments of the present disclosure will be briefly described again.

In order to prevent saturation of sensing data in consideration of parasitic capacitance generated in the display panel 110 or improve the intensity of a touch sensing value and increase the number of integrals in consideration of noise removal, the touch display device 10 according to embodiments of the present disclosure inserts the charge control circuit (QCC) into the first input terminal (IN1) of the pre-amplifier (Pre-AMP).

Meanwhile, since a charge speed according to the transmitted driving signal varies depending on the location of the touch electrode within the display panel 110 (that is, since the time constant varies), a difference in the charge amount according to the location of the touch electrode is generated if the speed at which charging is performed compared to the modulation frequency of the driving signal (TDS) is slow.

Further, a large amount of high-frequency noise may be generated in a transition section of the voltage level of the driving signal (TDS), and a high-frequency noise frequency band and a generation time point may be different according to the location of the touch electrode.

The influence of the charge control capacitor (CCR) on the transfer function (input/output relation) of the pre-amplifier (Pre-AMP) is related to turn-on timing of the charge control switch (SWCR) existing within the charge control circuit (QCC) and the location of the touch electrode.

When the charge control capacitor is added to the output of the pre-amplifier (Pre-AMP) at a transition time point, at which a large amount of high-frequency noise is generated in the modulation voltage of the driving signal (TDS), a signal-to-noise ratio (SNR) may be significantly reduced, and the signal-to-noise ratio (SNR) may vary depending on the size of the charge control capacitor (CCR) and the time point at which the charge control capacitor (CCR) is formed in the pre-amplifier (Pre-AMP). For example, as the charge control capacitor (CCR) is smaller and the charge control switch (SWCR) is turned on at the time at which the voltage state of the touch electrodes is more stabilized, the signal-to-noise ratio (SNR) may be improved.

In consideration of this, the touch display device 10 according to embodiments of the present disclosure may effectively control the time point at which the charge control capacitor (CCR) intervenes in the first input terminal (IN1) of the pre-amplifier (Pre-AMP) for location of each touch electrode in order to improve the signal-to-noise ratio (SNR) related to touch sensing at all locations within the display panel 110 through the charge control circuit (QCC) and maintain the uniformity of the signal-to-noise ratio (SNR).

That is, the touch display device 10 and the touch-driving circuit (TDC) according to embodiments of the present disclosure may improve the signal-to-noise ratio by controlling turn-on timing of the charge control switch (SWCR) for applying the charge control capacitor (CCR) according to the location of each touch electrode within the panel through the charge control circuit (QCC) or controlling application timing (voltage level change timing) of the charge control signal (VCR).

To this end, when a fluctuation width of sensing data (sensing value) on N (N being larger than or equal to 2) touch frames is identified by controlling the turn-on time point of the charge control switch (SWCR) or application timing (voltage level change timing) of the charge control signal (VCR), an optimal control time point according to the location of each touch electrode may be detected. The optimal control time point may be managed while being matched with each touch panel or each frequency.

According to embodiments of the present disclosure, since there is a different parasitic capacitance within the display panel 110 and a response characteristic varies depending on a modulation voltage frequency of the driving signal (TDS), by controlling a charge control time point to avoid a transition section (voltage-level-variable section) of the driving signal (TDS) in which a large amount of high-frequency noise is generated, touch sensing robust to noise applied to the touch-driving circuit (TDC) can be performed for each touch electrode, and the size and uniformity of the signal-to-noise ratio (SNR) can be improved in touch sensing. Particularly, a larger effect can be acquired in a high-resolution product group which more frequently uses pen touch.

The embodiments of the present disclosure may provide a touch display device 10, a touch-driving circuit, and a touch-sensing method which can realize a high signal-tonoise ratio without any influence of noise at any location even though respective touch electrodes are located at different positions.

The embodiments of the present disclosure may provide a touch display device 10, a touch-driving circuit, and a touch-sensing method which can prevent saturation of sensing data and realize a high signal-to-noise ratio by connecting a charge control circuit to an input terminal of a pre-amplifier.

The embodiments of the present disclosure may provide a touch display device 10, a touch-driving circuit, and a touch-sensing method which can reduce unnecessary variation in a signal-to-noise ratio for each touch electrode and improve touch sensitivity by controlling control operation timing of the charge control circuit connected to the input terminal of the pre-amplifier in consideration of a difference in the location or a time constant for each touch electrode.

It will be apparent to those skilled in the art that various modifications and variations can be made in the touch display device, the touch-driving circuit, and the touch-sensing method of the present disclosure without departing from the technical idea or scope of the disclosure. Thus, it is intended that the present disclosure cover the modifications and variations of this disclosure provided they come within the scope of the appended claims and their equivalents.

What is claimed is:

1. A touch display device, comprising:
   a touch screen panel comprising a plurality of touch electrodes; and
   a touch-driving circuit configured to supply a driving signal to the touch screen panel and receive a sensing signal from the touch screen panel,
   wherein the touch-driving circuit comprises:
   a pre-amplifier having a first input terminal to which the sensing signal for a touch electrode to be sensed among the touch electrodes is input; and
   a charge control circuit electrically connected between the first input terminal of the pre-amplifier and a charge control signal input terminal to which a charge control signal is input,
   the charge control circuit comprises a charge control switch and a charge control capacitor connected between the first input terminal of the pre-amplifier and the charge control signal input terminal by the charge control switch, and
   controls a charge input to the first input terminal of the pre-amplifier by turning on the charge control switch and changing a voltage level in the charge control signal after a first control time passes from a time point at which the driving signal changes from a first voltage level to a second voltage level, and
   the first control time is changed according to a location or a time constant of the touch electrode.

2. The touch display device of claim 1, wherein the first control time is set to be longer as the touch electrode is located farther from the touch-driving circuit or has a larger time constant.

3. The touch display device of claim 1, wherein, after the first control time passes from the time point at which the driving signal changes from the first voltage level to the second voltage level, the charge control signal applied to one electrode of the charge control capacitor connected to the first input terminal of the pre-amplifier by the charge control switch is changed from a third voltage level to a fourth voltage level.

4. The touch display device of claim 3, wherein, after a second control time passes after a time point at which the driving signal starts changing from the second voltage level to the first voltage level, the charge control signal changes from the fourth voltage level to the third voltage level, and the second control time is changed according to the location or the time constant of the touch electrode.

5. The touch display device of claim 4, wherein the second control time is set to be longer as the touch electrode is located farther from the touch-driving circuit or has a larger time constant.

6. The touch display device of claim 4, wherein the charge control switch is turned on after a first rising control time passes from a time point at which the driving signal starts rising from the first voltage level, corresponding to a low level, to the second voltage level, corresponding to a high level, and the charge control signal rises from the third voltage level, corresponding to the low level, to the fourth voltage level, corresponding to the high level, after a second rising control time passes from a time point at which the charge control switch is turned on.

7. The touch display device of claim 6, wherein a sum of the first rising control time and the second rising control time corresponds to the first control time, and the first rising control time is changed according to the location or the time constant of the touch electrode.

8. The touch display device of claim 7, wherein a length of the second rising control time is equal to or shorter than a length of a period during which the charge control switch maintains an on state.

9. The touch display device of claim 6, wherein the charge control switch is turned off after the charge control signal rises from the third voltage level to the fourth voltage level, the charge control switch is turned on after a first falling control time passes from a time point at which the driving signal starts falling from the second voltage level to the first voltage level, and the charge control signal falls from the fourth voltage level to the third voltage level after a second falling control time passes from a time point at which the charge control switch is turned on.

10. The touch display device of claim 9, wherein a sum of the first falling control time and the second falling control time corresponds to the second control time, and the first falling time is changed according to the location or the time constant of the touch electrode.

11. The touch display device of claim 10, wherein a length of the second falling control time is equal to or shorter than a length of a period during which the charge control switch maintains an on state.

12. The touch display device of claim 1, wherein a voltage-level-variable slope of the driving signal varies depending on the location or the time constant of the touch electrode during the first control time.

13. The touch display device of claim 1, wherein a charge amount corresponding to the sensing signal input to the first input terminal of the pre-amplifier in an on state of the charge control switch is different from a charge amount corresponding to the sensing signal input into the first input terminal of the pre-amplifier in an off state of the charge control switch.

14. The touch display device of claim 1, wherein the charge control capacitor comprises a first charge control capacitor and a second charge control capacitor,
   first electrodes of the first charge control capacitor and the second charge control capacitor are connected to each other, and second electrodes of the first charge control capacitor and the second charge control capacitor are connected to each other, and the charge control circuit further comprises:

a first selection switch configured to connect the first electrode of the first charge control capacitor and the charge control switch; and a second selection switch configured to connect the first electrode of the second charge control capacitor and the charge control switch.

15. A touch-driving circuit, comprising:

a pre-amplifier having a first input terminal configured to output a driving signal to touch electrodes and receive a sensing signal for the touch electrode to be sensed among the touch electrodes; and a charge control circuit electrically connected between the first input terminal of the pre-amplifier and a charge control signal input terminal to which a charge control signal is input, wherein the charge control circuit comprises a charge control switch and a charge control capacitor connected between the first input terminal of the pre-amplifier and the charge control signal input terminal by the charge control switch, and controls a charge input to the first input terminal of the pre-amplifier by turning on the charge control switch and changing a voltage level in the charge control signal after a first control time passes from a time point at which the driving signal changes from a first voltage level to a second voltage level, and the first control time is changed according to a location or a time constant of the touch electrode.

16. The touch-driving circuit of claim 15, wherein the first control time is set to be longer as the touch electrode is located farther from the touch-driving circuit or has a larger time constant.

17. The touch-driving circuit of claim 15, wherein the charge control switch is turned on after a first rising control time passes from a time point at which the driving signal starts rising from the first voltage level, corresponding to a low level, to the second voltage level, corresponding to a high level, and the charge control signal rises from the third voltage level, corresponding to the low level, to the fourth voltage level, corresponding to the high level, after a second rising control time passes from a time point at which the charge control switch is turned on.

18. The touch-driving circuit of claim 17, wherein a sum of the first rising control time and the second rising control time corresponds to the first control time, and the first rising control time is changed according to the location or the time constant of the touch electrode.

19. The touch-driving circuit of claim 17, wherein a length of the second rising control time is equal to or shorter than a length of a period during which the charge control switch maintains an on state.

20. The touch-driving circuit of claim 15, wherein a charge amount corresponding to the sensing signal input to the first input terminal of the pre-amplifier in an on state of the charge control switch is different from a charge amount corresponding to the sensing signal input into the first input terminal of the pre-amplifier in an off state of the charge control switch.

21. The touch-driving circuit of claim 15, wherein the charge control capacitor comprises a first charge control capacitor and a second charge control capacitor, first electrodes of the first charge control capacitor and the second charge control capacitor are connected to each other, and second electrodes of the first charge control capacitor and the second charge control capacitor are connected to each other, and the charge control circuit further comprises:

a first selection switch configured to connect the first electrode of the first charge control capacitor and the charge control switch; and a second selection switch configured to connect the first electrode of the second charge control capacitor and the charge control switch.

22. The touch-driving circuit of claim 15, wherein a voltage-level-variable slope of the driving signal varies depending on the location or the time constant of the touch electrode during the first control time.

23. A method of sensing a touch, the method comprising:

outputting a driving signal to touch electrodes by a touch-driving circuit;

receiving a sensing signal from the touch electrodes by the touch-driving circuit; and generating sensing data based on the sensing signal and outputting the generated sensing data by the touch-driving circuit, wherein, during the outputting of the driving signal, a charge control capacitor is connected between a first input terminal to which the sensing signal is input in the touch-driving circuit and a charge control signal input terminal to which a charge control signal different from the driving signal is input in the touch-driving circuit after a first control time passes from a time point at which the driving signal starts changing from a first voltage level to a second voltage level, and the charge control signal changing from a third voltage level to a fourth voltage level is applied to one electrode of the charge control capacitor, and the first control time is changed according to a location or a time constant of the touch electrode.

24. The method of claim 23, wherein the first control time is set to be longer as the touch electrode is located farther from the touch-driving circuit and has a larger time constant.

* * * * *